(12) United States Patent
Kato et al.

(10) Patent No.: US 6,646,932 B2
(45) Date of Patent: Nov. 11, 2003

(54) SEMICONDUCTOR MEMORY DEVICE HAVING REDUNDANCY SYSTEM

(75) Inventors: Daisuke Kato, Kamakura (JP);
Munehiro Yoshida, Yokohama (JP);
Yohji Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/162,433

(22) Filed: Jun. 3, 2002

(65) Prior Publication Data

US 2002/0181303 A1 Dec. 5, 2002

(30) Foreign Application Priority Data

Jun. 4, 2001 (JP) ........................................ 2001-168707

(51) Int. Cl.[7] ................................................ G11C 7/00
(52) U.S. Cl. .............. 365/200; 365/230.03; 365/230.06
(58) Field of Search ............................ 365/200, 230.03, 365/230.06, 230.08, 225.7, 189.05

(56) References Cited

U.S. PATENT DOCUMENTS 5,894,441 A    4/1999  Nakazawa
6,052,318 A  *  4/2000  Kirihata et al. ............. 365/200

* cited by examiner

Primary Examiner—David Lam
(74) Attorney, Agent, or Firm—Hogan & Hartson, LLP

(57) ABSTRACT

A semiconductor memory device has a cell array, first normal elements each defined within the cell array as a group of memory cells arranged in a first direction of the cell array, second normal elements each defined within the cell array as a group of memory cells arranged in a second direction of the cell array, each the second normal element selecting a memory cells in operative association with a corresponding one of the first normal elements, first redundant elements disposed for replacement of defective first normal elements within the cell array, and second redundant elements disposed for replacement of defective second normal elements within the cell array. There are defined within the cell array first/second repair region as group of first/second normal elements with permission of replacement by each first/second redundant element.

26 Claims, 18 Drawing Sheets

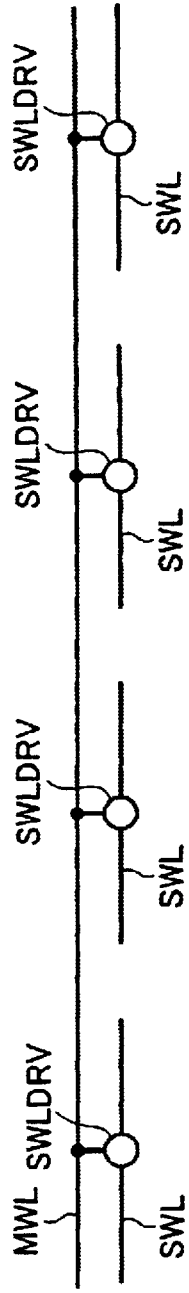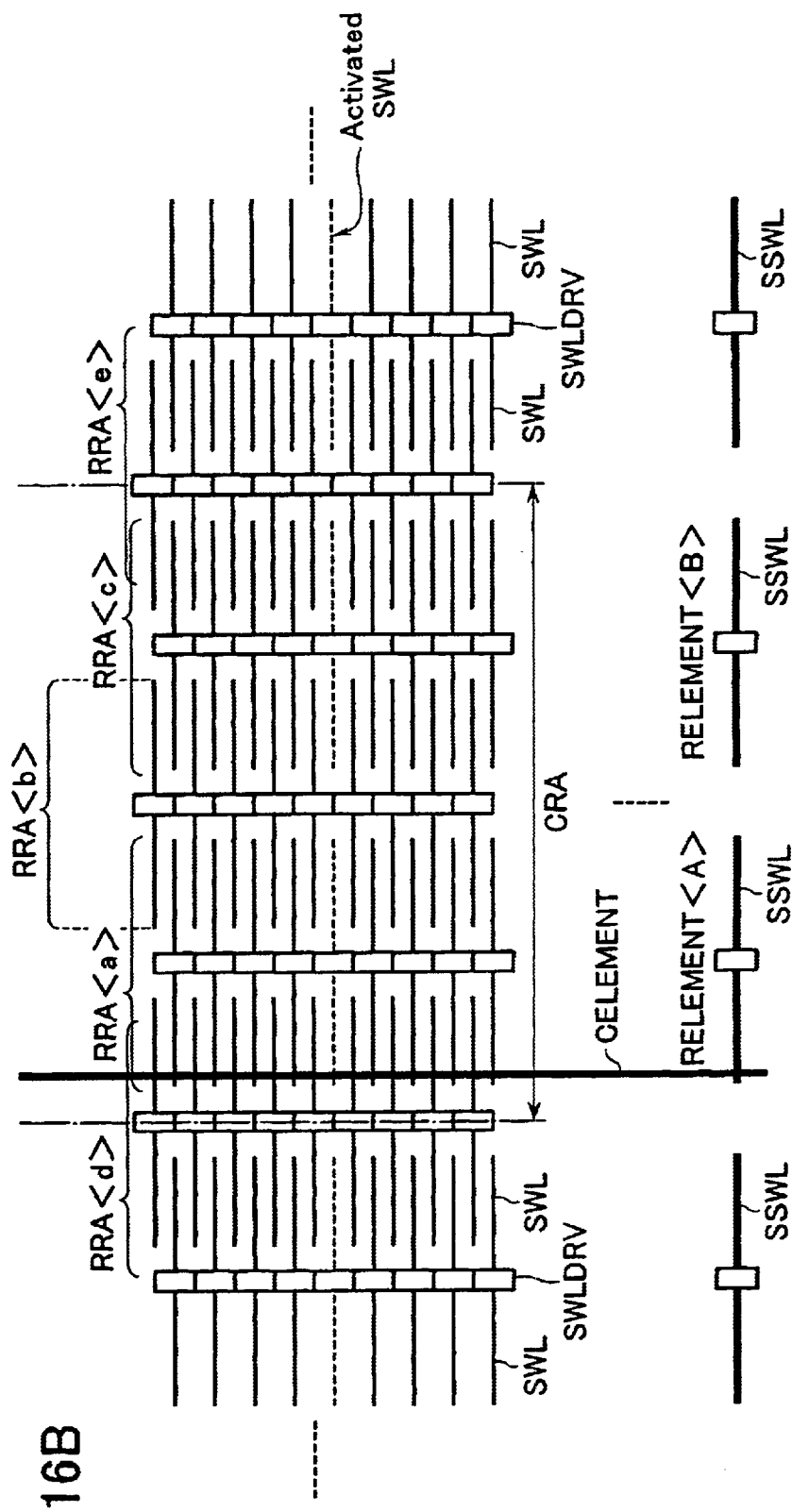
FIG. 16A
FIG. 16B

SEMICONDUCTOR MEMORY DEVICE HAVING REDUNDANCY SYSTEM

CROSS REFERENCE TO RELATED APPLICATION

This application is based on and claims the benefit of priority from prior Japanese Patent Application No. 2001-168707, filed on Jun. 4, 2001, the entire content of which is incorporated herein by reference.

BACKGROUND OF THE INVENTION

1. Field of the Invention

This invention relates generally to semiconductor memory devices and more particularly to redundancy systems for relieving or "repairing" defects in memory cells.

2. Description of the Related Art

A redundancy system for use with semiconductor memory chips includes a row redundancy system for repairing defective rows (i.e. rows containing defective cells) and a column redundancy system for repairing defective columns (columns including defective cells), which are typically built together. The row redundancy system is the one that is operatively responsive to input of a row address corresponding to a defective row within a memory array, for providing access to a spare row in lieu of access to such defective row. More specifically, when a row address for selection of a word line containing a defective cell, replacement control is performed in such a way as to activate a spare word line instead of activation of the word line. The column redundancy system is one that is operatively responsive to input of a column address corresponding to a defective column within a memory array while a row corresponding to an input row address within the memory array is accessed (for example, in the state that a word line is activated), for giving access to a spare column in place of access to such defective column. One example is that in a column redundancy system which permits replacement of a column select line (or bit line) with a spare column select line (or spare bit line), replacement control is done for activating a spare column select line (or spare bit line) that performs read/write relative to a spare cell on the accessed row in place of access to such defective column. It is appreciated that the "column select line" is not only a signal line for controlling a column switch which connects a selected bit line with a data line, but also a data line in such a column redundancy system that a defective data line is repaired by another data line.

In this way, the currently available redundancy system is not arranged to perform defective cell replacement by replacement with spare cells on a per-cell basis but is arranged generally to replace a plurality of cells aligned in parallel to a defective cell-containing row or column with a plurality of spare cells within a spare row or spare column. In the rest of the description, an aggregation or assemblage of multiple cells in the direction of a row being subjected to defective cell replacement and a signal line for selecting this will be referred to hereinafter as a "normal row element" or more simply "row element." An assembly of multiple cells in the direction of a column being subject to defective cell replacement and a signal line for selecting this will be called the "normal column element" or simply "column element" hereinafter. A set of spare cells for use as a defective row/column replacement unit and a signal line for selecting this will be called "redundant element." In a system for performing defect replacement relative to both rows and columns, both redundant row elements and redundant column elements are provided. Further, the "element" should not be limited only to a set of physically continued cells to be selected by a single signal line and may also be a two-dimensional (2D) aggregation of cells along with a combination or "bundle" of multiple signal lines for selecting them together at a time.

See FIG. 18, which shows a redundancy system in one prior known semiconductor memory. A memory array shown herein is subdivided into two, upper and lower memory blocks with a sense-amplifier (S/A) bank interposed therebetween. The lower half memory block includes a redundant row element RELEMENT<0> as disposed therein, which is assigned for replacement of a defective row element found within the lower half memory block. Disposed in the upper half memory block is another redundant row element RELEMENT<1> which is assigned to replacement of a defective row element within the upper half memory block.

The memory array is also bisected laterally into right and left regions as indicated by dotted line in FIG. 18. A redundant column element CELEMENT<0> is disposed in the resultant left half region and is assigned to replacement of a column element within the left half region. Disposed in the right region is a separate redundant column element CELEMENT<1> which is assigned to replacement of a defective column element within the right half region.

In this description, an aggregation of normal elements within the memory array which are replaceable by a certain redundant element will be called the relief or "repair" region by means of such redundant element. Repair regions are assigned in units of redundant elements. With the example of FIG. 18, row repair regions assigned to the redundant row elements RELEMENT<0>, <1> are upper and lower half ones RRA<0>, <1> of the memory array, respectively; column repair regions assigned to the redundant column elements CELEMENT<0>, <1> are left and right half ones CRA<0>, <1> of the memory array, respectively.

A defective cell in the memory array is replaceable by use of either one of a redundant row element or redundant column element. This means that as shown in FIG. 18, a single row repair region must have, without fail, an "overlap region" in which the row repair region at least partially overlaps one or more other column repair regions.

Turning to FIG. 19, there is shown a relationship of redundant row and column regions when looking at a single overlap region. Replacement by means of redundancy is to replace defective elements with redundant elements as described previously. In cases where a defective element includes a cell within this overlap region of interest, part of such defective element as included this overlap region will be called the "partial" defective element. In addition, part of the redundant element for replacement of this partial defective element will be called the partial redundant element. Although in FIG. 19 an exemplary case is shown in which defective cells indicated by markings "x" are present in partial defective row and column elements within an overlap region respectively, the defective cells may exist anywhere at defective elements including partial defective elements—these can be present outside of the overlap region from time to time.

In prior art redundancy systems, the redundant element versus repair region relationship relative to an overlap region is set up so that a redundant row element assigned to a row repair region including such overlap region and a redundant column element assigned to a column repair region including the same overlap region cross or "intersect"

each other. The mutual intersection of the redundant row and column elements with respect to the overlap region in this way means that a cell on the redundant column element assigned to the same overlap region is selectable by the redundant row element assigned to such overlap region; similarly, any cell on the redundant row element assigned to the overlap region is selectable by the redundant column element assigned to the overlap region.

The feature of prior art redundancy systems may be reworded in a manner such that the relationship of multiple redundant row elements and redundant column elements on a memory chip versus repair regions to which these are assigned is set to satisfy a condition which follows. All available normal row elements for cell selection within an overlap region being subjected to replacement by means of a certain redundant row element (where, the normal row elements include partial normal row elements within the overlap region, or may be completely included in the overlap region, thereby the partial normal row elements being identical to the normal row elements) intersect, without fail, any redundant column element assigned to column replacement within such overlap region. Similarly, all normal column elements for cell selection within an overlap region being presently subject to replacement by means of a certain redundant column element (where, the normal column elements include partial normal column elements within the overlap region, or may be completely included in the overlap region, thereby the partial normal column elements being identical to the normal column elements) intersects with no fail any redundant row element as assigned to row replacement within the overlap region.

Accordingly, in view of the capability to select a cell on a redundant column element by a certain normal row element with respect to a certain overlap region, whenever such normal row element is replaced by a redundant row element, a cell corresponding to the row address of such to-be-replaced normal row element is additionally replaced on the redundant column element also. Similarly, in light of the ability to select a cell on a redundant row element by a certain normal column element with respect to a given overlap region, whenever such normal column element is replaced with a certain redundant column element, a cell corresponding to the column address of such to-be-replaced normal column element is additionally replaced on the redundant row element also.

Additionally, mutual intersection of redundant row and column elements corresponding to an overlap region means that a spare cell is present at a cross point thereof. For example, intersection of a spare word line which is a redundant row element and a spare column select line which is a redundant column element means that a spare cell these lines operate together to select is present. This spare cell is generally known as a "limbo cell" as shown in FIG. 19. With this system, any cell which resides at the cross-point or intersection of partial row and partial column elements within the overlap region is to be replaced by this limbo cell.

An explanation will be given of problems faced with the prior art redundancy system with reference to FIG. 20 below. As shown in FIG. 20 a semiconductor memory chip is arranged to include a plurality of memory arrays MA<0>, MA<1>, . . . , MA<7>. In the example of FIG. 20, each memory array comes with two redundant row elements RELEMENT and two redundant column elements CELEMENT as disposed therein, wherein two row relief regions and two column relief regions formed thereby are provided. In this way, a great number of redundant row and redundant column elements are present on the memory chip. These redundant row and column elements are combinable in a variety of patterns. However, mutually crossing redundant row and column elements are limited in combinability.

Accordingly, when determining a redundant element assigned to each repair region, designing to permit redundant row and column elements that constitute the so-called overlap region with row and column repair regions overlapping to intersect each other can limit the range of choice of redundant elements while lessening the degree of freedom or flexibility in redundancy designs, which becomes a bar to enhancement of the replacement efficiency or "repair efficiency." In other words, setting a repair region by means of redundant row and column elements in such a way that redundant row/column elements to be assigned to an overlap region have limbo cells such as indicated by "○" in FIG. 20 narrows the range of choice of redundant elements, resulting in limitation of achievement of high repair efficiencies. Additionally, in light of the fact that redundancy circuit designs are closely related to memory array configurations and/or other peripheral circuit designs, the limitation to the flexibility in redundancy designs would result in the entire chip also being limited in design flexibility, which leads to an increase in chip size and/or a decrease in performance.

SUMMARY OF THE INVENTION

A semiconductor memory device includes a cell array having a plurality of memory cells, a plurality of first normal elements each defined within said cell array as a group of memory cells arranged in a first direction with a first select line for memory cell selection, a plurality of second normal elements each defined within said cell array as a group of memory cells arranged in a second direction with a second select line for memory cell selection, each said second normal element selecting one or more memory cells in operative association with a corresponding one of said first normal elements, a plurality of first redundant elements disposed for replacement of a defective first normal element within said cell array, and a plurality of second redundant elements disposed for replacement of a defective second normal element within said cell array. In the cell array, first and second repair regions are provided. The first repair region is defined as a group of first normal elements with permission of replacement by each of the first redundant elements. The second repair region is defined as a group of second normal elements with permission of replacement by each of the second redundant elements. At least two of the plurality of first normal elements are activated simultaneously. Whether such simultaneously activated at least two first normal elements are replaced by the first normal elements is controlled independently of each other. At least one of the second redundant elements, which repairs a second normal element having a defect that locates in one of the first repair regions including one of the simultaneously activated at least two first normal elements, does not intersect the one of the simultaneously activated at least two first normal elements.

BRIEF DESCRIPTION OF THE DRAWINGS

Several embodiments will be explained with reference to the accompanying drawing below.

FIGS. 16A and 16B are diagrams showing a semiconductor memory redundancy system in accordance with a seventh embodiment of this invention.

DETAILED DESCRIPTION OF THE EMBODIMENTS

Embodiment 1

A semiconductor memory in accordance with a first embodiment of the invention includes a cell array, a plurality of normal row elements defined in the cell array as a group of memory cells arranged in a row direction and including a select line for selecting thereof, and a plurality of normal column elements defined in the cell array as a group of memory cells arranged in a column direction and including a select line for selecting thereof, each the second normal element selecting a memory cell in operative association with a corresponding normal row elements. Additionally disposed are a plurality of redundant row elements for replacement of normal row elements found to be defective within the cell array and a plurality of redundant column elements for replacement of defective normal column elements. Within the cell array, a row repair region is defined as a group or an aggregation of normal row elements which are permitted to experience replacement by each redundant row element. Also defined in the cell array is a column repair region, which is an ensemble of normal column elements with permission of replacement through the use of each redundant column element.

With the basic arrangement stated above, Embodiment 1 is such that at least two of the plurality of normal row elements are made active simultaneously, while permitting these normal row elements to be controlled independently of each other as to replacement by redundant row elements, and also that a normal column element found to be a defect or fault within a row repair region which contains one of the simultaneously activated at least two normal row elements is replaced with a redundant column element which is for memory cell selection in association with the other of the normal row elements. Further in Embodiment 1, a relationship of the cell array's row/column repair regions versus the redundant elements is selected in such a manner that a redundant row element assigned to an overlap region in which the row and column repair regions overlap each other and a redundant column element corresponding to the same overlap region do not cross or interest each other.

Figure 1:
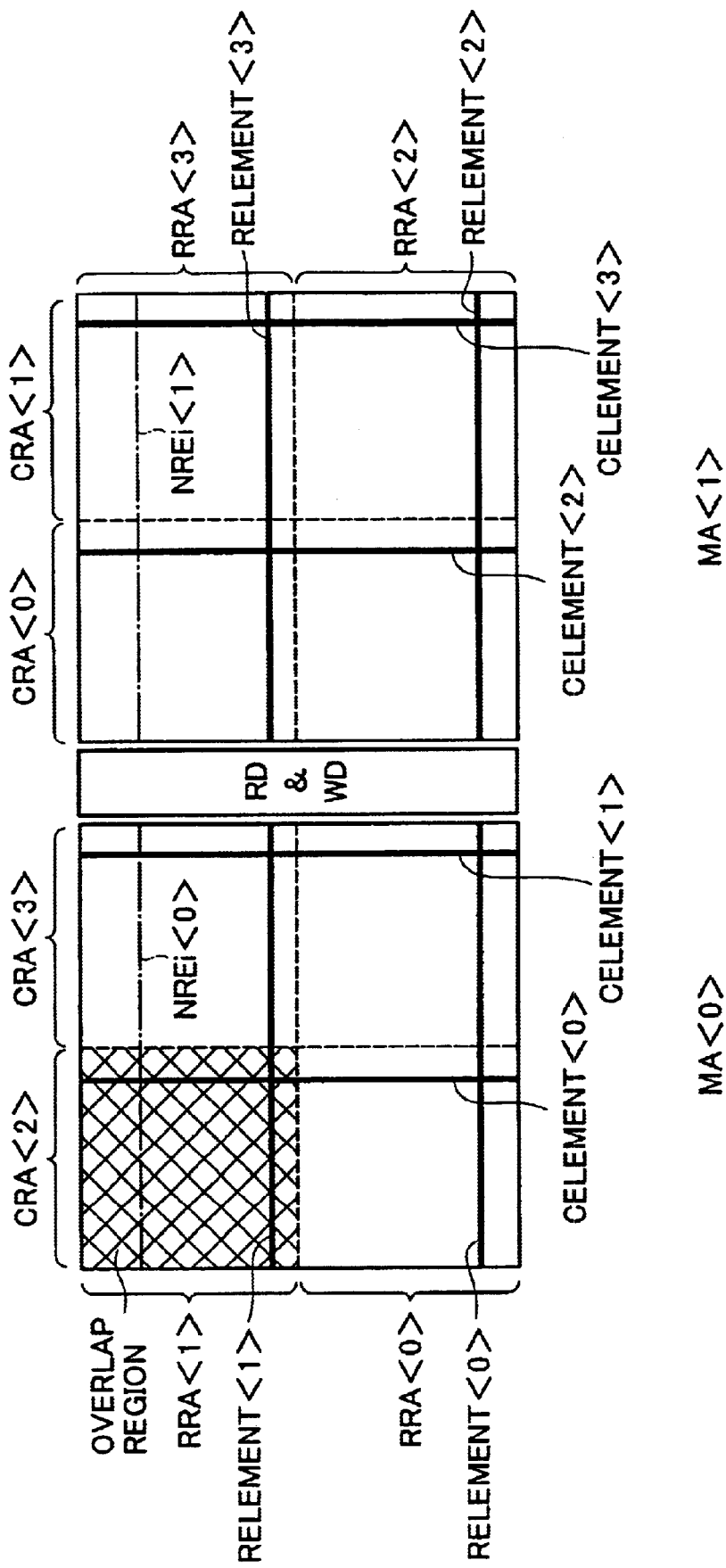
FIG. 1 is a diagram showing a redundancy system for use with a semiconductor memory in accordance with a first embodiment of this invention.

FIG. 1 is a diagram for explanation of Embodiment 1, which shows part of the cell array of a semiconductor memory chip including two neighboring memory arrays MA<0> and MA<1> with a row decoder/word-line driver (RD&WD) interposed therebetween. Although not specifically depicted herein, a plurality of normal row elements and a plurality of normal column elements are respectively disposed in the memory arrays MA<0>, <1> independently.

In the memory array MA<0>, redundant row elements RELELEMENT<0>, <1> which are used for replacement of defective row elements and redundant column elements CELEMENT<0>, <1> used for defective column element replacement are disposed. Similarly in the memory array MA<1> also, redundant row elements RELELEMENT<2>, <3> and redundant column elements CELEMENT<2>, <3> are laid out.

The redundant column elements CELEMENT<0>, <1> disposed in the memory array MA<0> commonly have or "share" row elements whereas the redundant row elements RELELEMENT<0>, <1> disposed in the memory array MA<0> share column elements. The redundant row elements RELELEMENT<0>, <1> and redundant column elements CELEMENT<0>, <1> on the memory array MA<0> side intersect each other to thereby have so-called limbo cells. Principally the relationship above also goes with the memory array MA<1>.

In this embodiment, when a row address is input, row elements NREi<0>, <1> corresponding to such input row address are activated simultaneously in such a manner that one of them is from the left-side memory array MA<0> and the other thereof is from the right-side memory array MA<1> as exemplarily shown in FIG. 1.

Although only two memory arrays are shown in FIG. 1, row elements may be activated simultaneously within a plurality of memory arrays rather than these mere two memory arrays when reduction to practice. A practically implemented example is that while each of the memory arrays MA<0>, MA<1> is a range with continuous layout of a row element (word line), it is specifically arranged so that upon inputting of a row address, word lines are made active simultaneously in the memory arrays MA<0>, MA<1> by the row decoder/wordline driver (RD&WD) as disposed between the two memory arrays MA<0>, MA<1>. This is the condition inherently required by a redundancy system in this embodiment, as will be described later.

The memory array MA<0> is bisected in up/down direction (column direction), wherein respective ones thus divided are defined as row repair regions RRA<0>, <1> which are defined as aggregations of row elements replaceable by redundant row elements RELEMENT<0>, <1>, respectively. Similarly the memory array MA<1> is bisected into upper and lower portions so that respective ones thus divided are defined as row repair regions RRA<2>, <3> which are ensembles of row elements replaceable by redundant row elements RELEMENT<2>, <3>. Accordingly, two normal row elements to be made active simultaneously in the laterally disposed memory arrays MA<0>, MA<1> belong to different row repair regions; thus, it is possible to determine whether these are repaired or "relieved" by redundant row elements in a way independent of each other.

On the other hand, with this embodiment, the one that is disposed on the memory array MA<1> side and spaced apart from the memory array MA<0> is used as a redundant column element for replacement of a defective column element within the memory array MA<0>. A redundant column element for defective column replacement of memory array MA<1> may be the one that is laid out on the memory array MA<0> side. In order to perform such column redundancy, the above-stated simultaneous activation of two memory arrays MA<0>, MA<1> becomes necessary.

A detailed explanation of the relationship of the memory arrays MA<0>, <1> of redundant column elements is as follows. The memory array MA<0> is bisected laterally (in row direction) into portions, which are set as column repair regions CRA<2>, <3> by means of the redundant column elements CELEMENT<2>, <3> as disposed on the memory array MA<1> side, respectively. Similarly the memory array MA<1> is also bisected laterally into portions which are set as column repair regions CRA<0>, <1> by means of the redundant column elements CELEMENT<0>, <1> as disposed on the memory array MA<0> side respectively.

Additionally, when taking a look at an overlap region in which the row repair region RRA<1> and the left-half column repair region CRA<2> of the memory array MA<0>, a redundant row element being allocated to this overlap region is RELEMENT<1> as disposed in the same memory array MA<0> whereas a redundant column element is CELEMENT<2> disposed in its neighboring memory array MA<1> (alternatively, may be CELEMENT<3>). To be brief, the redundant row and column elements to be assigned to the overlap region of the row and column repair regions do not intersect each other. In other words the row and column redundant elements corresponding to the overlap region does not have any limbo cell as cross point cell.

Similarly, with regard to the right-half column repair region CRA<3> of the memory array MA<0>, the redundant column element CELEMENT<3> (or CELEMENT<2>) on the memory array MA<1> side is selected. Similarly, regarding the right-side memory array MA<1>, redundant column elements CELEMENT<0>, <1> which are disposed in the left-side memory array MA<0> are allocated with respect to its left and right half column repair regions CRA<0>, <1>.

Figure 9:
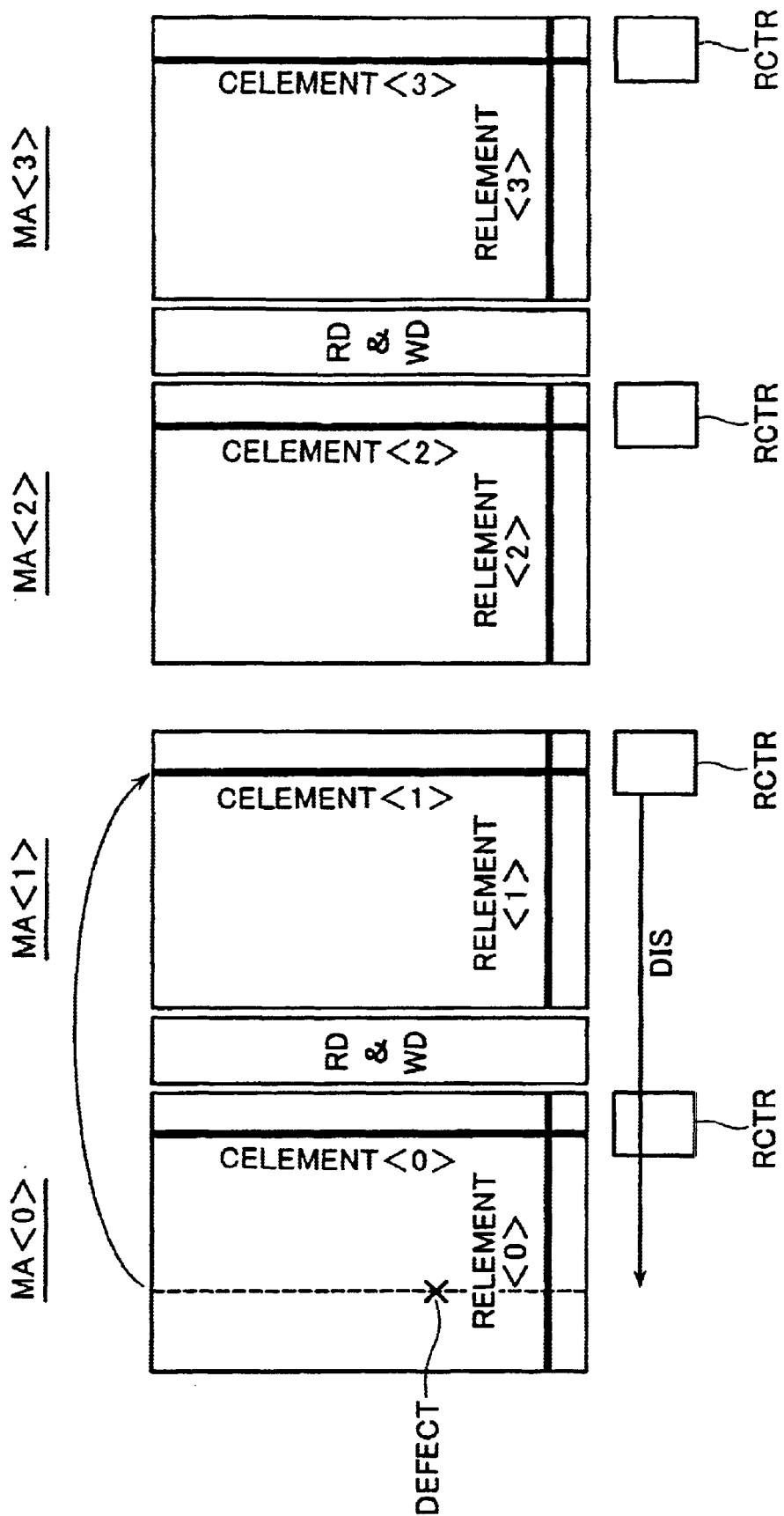
FIG. 9 is a diagram showing a redundancy system of a semiconductor memory in accordance with a third embodiment of this invention.

In many cases, not merely two memory arrays but a further increased number of memory arrays are laid out on a memory chip as shown in FIG. 9 by way of example. If this is the case, when looking at a certain redundant row element, redundant column elements that do not intersect this element becomes greater in number than redundant column elements that cross it. Permitting overlap of column repair regions by means of these multiple redundant column elements makes it possible to increase the number of redundancy elements relative to a repair region. In other words, when compared to prior art schemes, a range which can be relieved by a single redundant column element becomes widened, thereby enabling establishment of a redundancy system high in repair efficiency. More practically, with a prior known scheme, when defective columns are concentrated to a certain region, any successful repair is no longer achievable because of the fact that redundant column elements with this place as a repair region are limited in number. In contrast, with this embodiment, enabling replacement of any defective column in any region falling within the range of a memory array with its all redundant column elements activated at a time makes it possible to relieve even in the presence of such column defect concentration or "localization," as far as the number of all defects is within the range of a total number of redundant column elements. Thus it is possible to establish the intended redundancy system which is higher in repair efficiency than ever before.

Although in FIG. 1 a specific case is shown where the simultaneously activated multiple normal elements to be repaired by redundant elements independently of one another are row elements, the present invention may also be applied to other cases where the row/column relationship is reversed causing a plurality of column elements to be activated simultaneously to thereby permit each to be repaired by a redundant column element separately. Additionally, a respective one of the redundant elements shown in FIG. 1 may alternatively be considered as a plurality of spare signal lines rather than a single spare signal line. Such plurality of spare signal lines making up a single redundant element may be disposed together at a location or alternatively distributed to reside at several spaced-apart locations on a chip. Also note that each redundant element should not exclusively be an aggregation of continued spare cells. Further note that redundant elements may alternatively be laid out in its own "reserved" separate array(s). These modifications are possible not only with this embodiment but also with any one of other embodiments as will be set forth later in the description.

Figure 2:
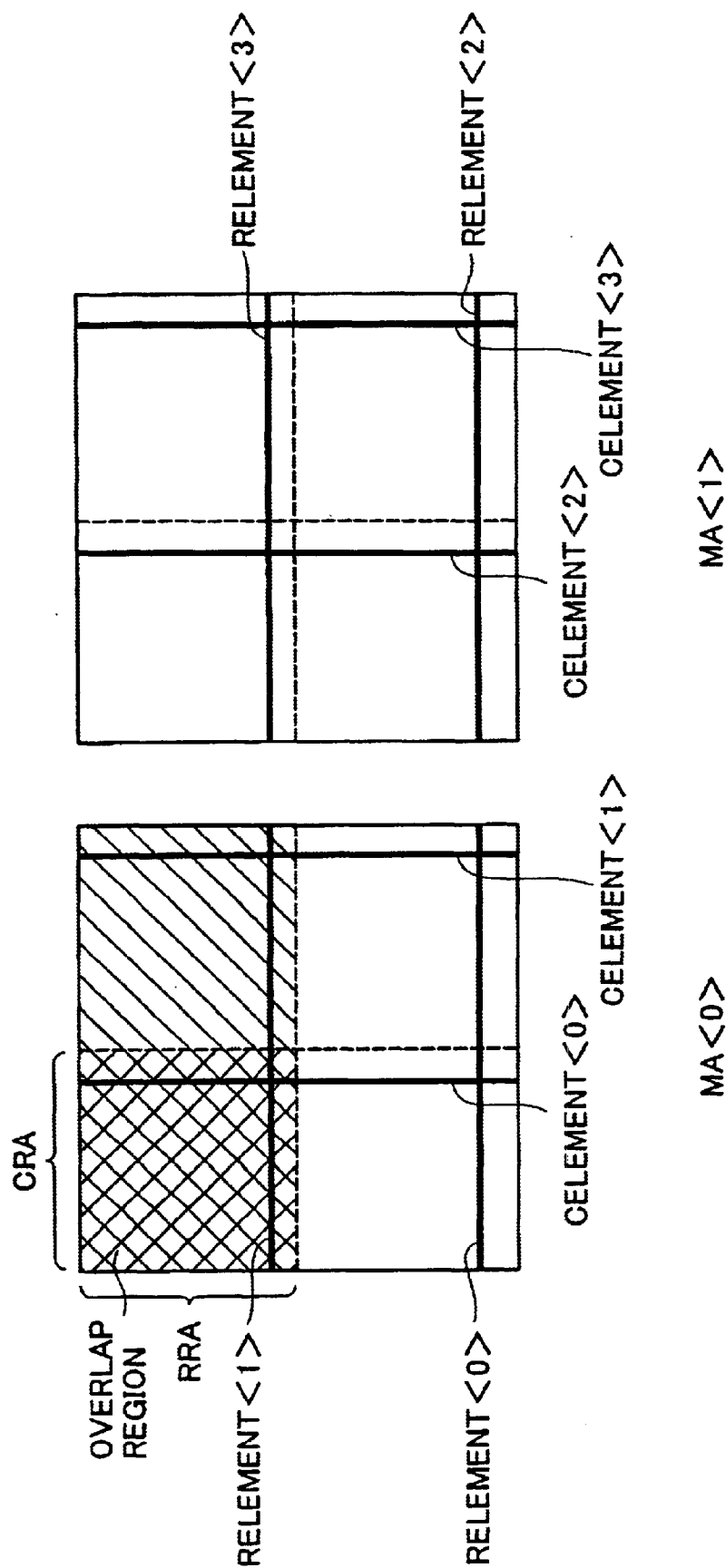
FIG. 2 is a diagram showing an example with overlap of a row repair region and a column repair region in the embodiment of FIG. 1.

FIG. 2 shows, in an easy-to-see fashion, the relationship of a set of column repair region CRA and row repair region RRA for defining the overlap region in FIG. 1. When looking at one set of row repair region RRA and column repair region CRA with hatching patterns of mutually differently angled oblique lines added thereto and its overlap region, a region other than the overlap region is present within the row repair region RRA; a region other than the overlap region exists within the column repair region CRA also. This is equivalent to a case where these row and column repair regions RRA, CRA interest together resulting in part of each becoming the overlap region.

Figure 3:
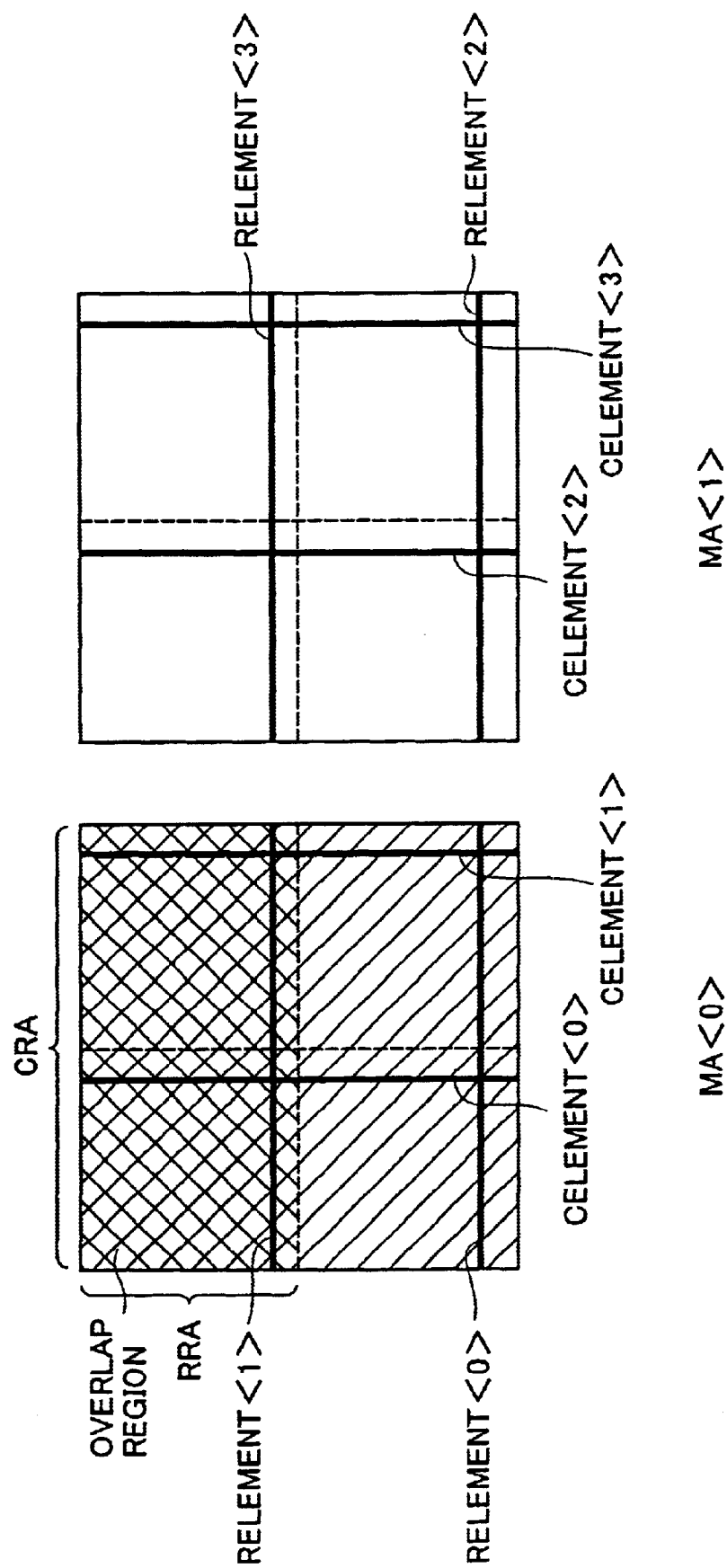
FIG. 3 is a diagram showing an example with the row repair region included in the column repair region in the FIG. 1 embodiment.

FIG. 3 shows another form different from that of FIG. 2. More specifically, this is an example in which the entirety of a memory array MA<0> becomes a single column repair region CRA whereas the row repair region RRA becomes an upper half portion of the memory array MA<0>. The fact that the entire memory array MA<0> becomes a single column repair region CRA means in other words that both of the redundant column elements CELEMENT<2>, <3> which are disposed in a right-side memory array MA<1> cause the entire memory array MA<0> to be a repair region. In this case, the row repair region RRA is completely included within the column repair region CRA, resulting in the row repair region RRA directly becoming an overlap region. A redundant row element being assigned to the overlap region (row repair region) is either RELEMENT<0> or RELEMENT<1>.

In this case also, the redundant row element and redundant column element to be allocated to the overlap region with overlap of row and column repair regions do not intersect each other.

Figure 4:
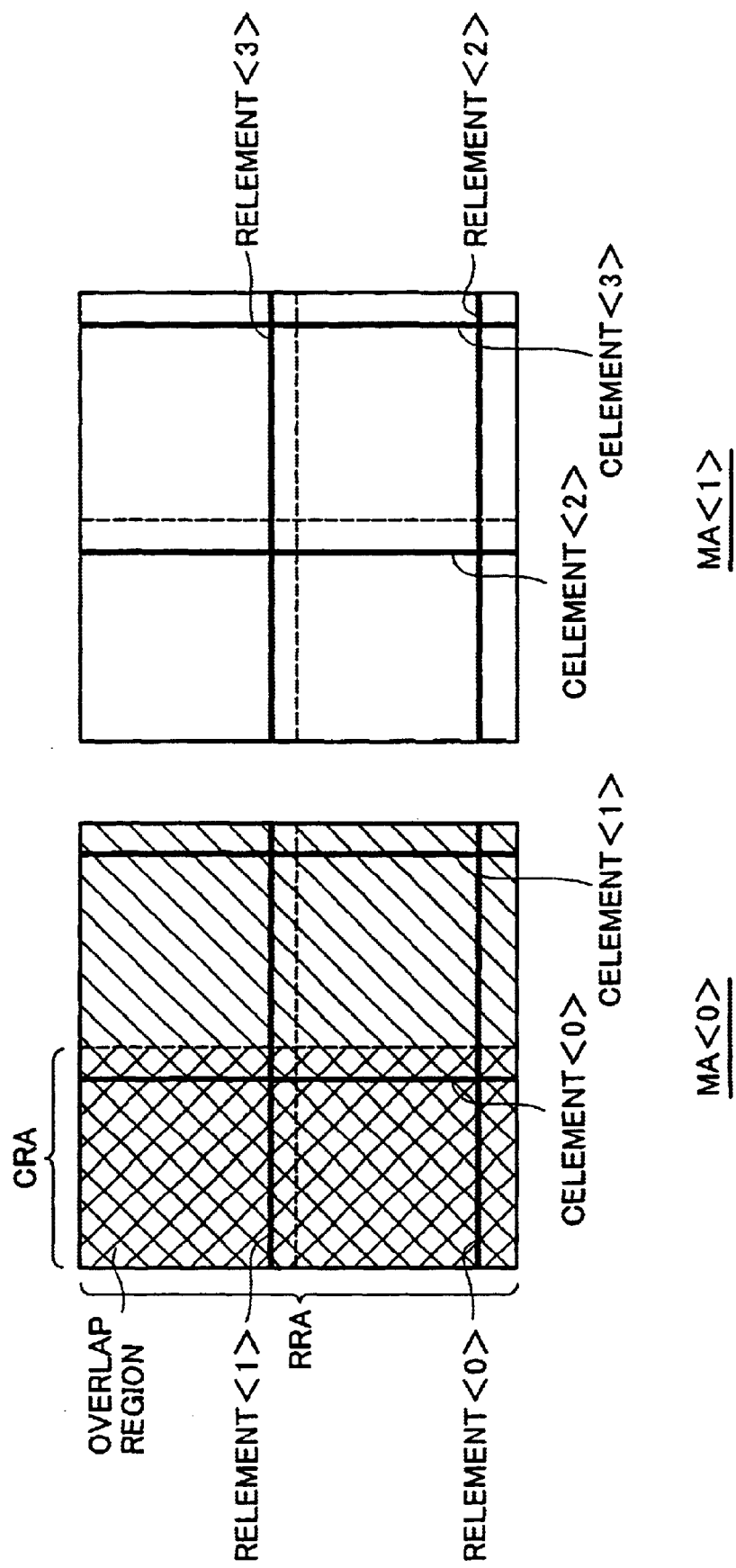
FIG. 4 is a diagram showing an example with the column repair region included in the row repair region in the FIG. 1 embodiment.

FIG. 4 shows an example in which the entire memory array MA<0> becomes a single row repair region RRA whereas the column repair region CRA becomes a laterally divided half portion of memory array MA<0> in a way contrary to that of FIG. 3. The fact that the entire memory array MA<0> becomes a single row repair region RRA means that the both redundant row elements RELEMENT<0>, <1> being disposed in memory array MA<0> permit the entire memory array MA<0> to be a repair region. In this case the column repair region CRA is completely included within the row repair region RRA with column repair region CRA directly becoming an overlap region. A redundant column element corresponding to the overlap region (column repair region) is either the memory array MA<1> side redundant column element CELEMENT<2> or element CELEMENT<3>. In this case also, redundant row and column elements corresponding to the overlap region with overlap of row and column redundancy repair regions do not cross each other.

Figure 5:
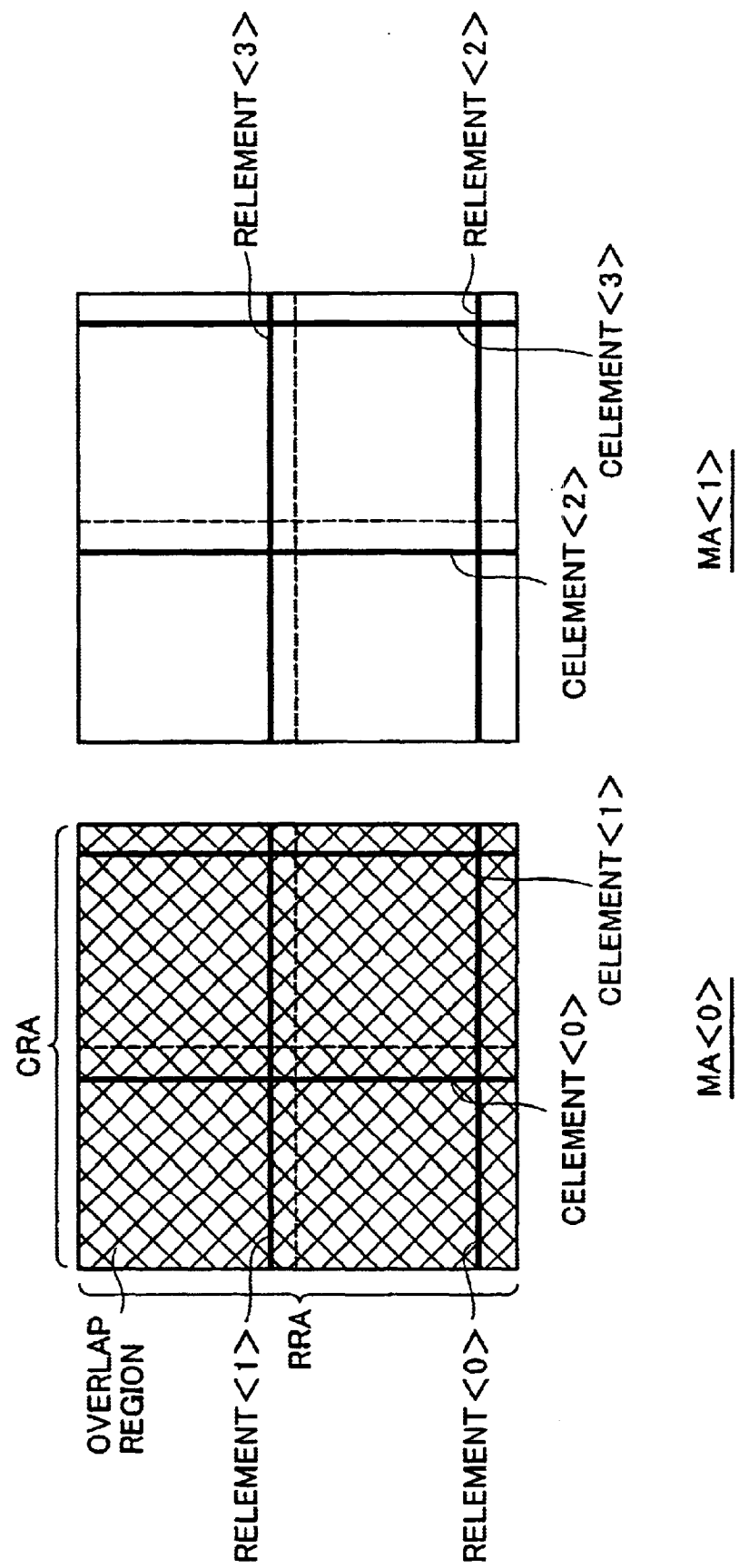
FIG. 5 is a diagram showing an example with the row repair region and the column repair region made completely identical to each other in the FIG. 1 embodiment.

FIG. 5 is a further example with complete coincidence of a pair of row repair region RRA and column repair region CRA. Here, there is shown a case where the entirety of a single memory array is a single row repair region RRA and simultaneously serves as a single column repair region CRA; thus, these row and column repair regions RRA, CRA are direct use as an overlap region. More specifically, both redundant row elements RELEMENT<0> and <1> are used together for row repairing on the memory array MA<0> side; for column repairing of the memory array MA<0>, both redundant column elements CELEMENT<2> and CELEMENT<3> on the neighboring memory array MA<1> side are used together. In this case also, the redundant row and column elements corresponding to the overlap region in which row and column redundancy repair regions overlap do not intersect each other.

It would readily occur to experts in the art that any available alterations as to these relationships of the pair of row and column relief regions and its overlap region will also possible not only to Embodiment 1 but also to the embodiments as will be discussed later.

Additionally with Embodiment 1, although when taking a look to the overlap region of a pair of row and column repair regions RRA, CRA a normal row element including a partial normal row element for selection of a cell within such overlap region does not intersect any redundant column element for replacement of the normal column element including the partial normal column element for cell selection within the overlap region, a normal column element including a partial normal column element for selection of a cell within the overlap region intersects a redundant row element for replacement of the normal row element including the partial normal row element for cell selection within the overlap region.

Note here that the language "normal row element does not intersect any redundant column element" as used herein means that no cells on the redundant column element are selected by such normal row element. In other words, even where such normal row element is replaced by a redundant row element, a cell corresponding to a row address of such normal row element to be replaced on the redundant column element will not always be replaced. The wording "not always" is used here because it is no longer available in cases where another normal row element is also replaced which is for selection of a cell corresponding to the row address of such normal row element being replaced on the redundant column element.

In addition, as the normal column element for cell selection within the overlap region intersects a redundant row element, it is possible to select a cell or cells on the redundant row element by such normal column element. Consequently, whenever the normal column element is replaced by a redundant column element, any cell corresponding to the column address of the normal column element being replaced on the redundant row element will also be replaced.

What is also noted here is that even though the normal column element assigned to the overlap region does not intersect any normal row element for cell selection within such overlap region, it must intersect either another normal row element to be simultaneously activated together with the normal row element for cell selection within such overlap region or a redundant row element which replaces the another normal row element. The reason of this is as follows. A column redundancy system is such that in case a column address corresponding to a defect within a memory array is input during activation of a row corresponding to an input row address within the memory array, this system provides access to a spare cell on the row corresponding to the input row address in lieu of accessing a cell corresponding to the column address on the same row. Accordingly, unless a normal row element (alternatively, a redundant row element has been selected in lieu of the normal row element) for selection of a spare cell on the redundant column element to be used for replacement is activated, it is no longer possible to give access to the spare cell in any way. Thus, it is not always possible to employ every redundant column element which does not cross the normal row element for cell selection within the overlap region as the redundant column element being assigned to the overlap region, which should be selected from among those falling within the range of memory arrays to be activated simultaneously.

Considering in this way, a principal feature of Embodiment 1 may also be interpreted so that a redundant column (row) element to be applied to an overlap region of the row and column redundancy repair regions is selected from among redundant column (row) elements which cross another normal row (column) element being simultaneously activated along with the normal row (column) element for selection of a cell within the overlap region. And, these multiple simultaneously activated normal row (column) elements are to be replaced with redundant row (column) elements in a way independent of one another. Consequently, the simultaneously activated row (column) elements may be such that all of them are normal elements or alternatively part thereof is replaced by one or more redundant elements. The simultaneous activation means that the same row (column) address corresponds to such multiple normal row (column) elements.

Additionally the event that a presently selected redundant column (row) element for the overlap region crosses another simultaneously selected normal row (column) element means that it is possible to select a redundant column (row)

element by the another normal row (column) element, wherein in case the another normal row (column) element is replaced by a redundant row (column) element, any cell which corresponds to a row (column) address of the another normal row (column) element being replaced on a presently selected redundant column (row) element is also replaced.

In such a case that a row (column) element includes a plurality of select lines, the event that the row (column) element is activated means a state that at least one of the select lines in the row (column) element is activated. And, in order to simultaneously activating plural rows (columns), it is necessary that these are driven by the respective select circuits/drivers, independently. A detailed explanation of the above-noted interrelated conditions is as follows. The redundant column elements CELEMENT<0>, <1> disposed in the region of the memory array MA<0> of FIG. 1 intersect or cross a word line in a region of normal element of memory array MA<0>. More specifically, within memory array MA<0>, the word line is disposed to continuously extend to span the normal column element region and regions of redundant column elements CELEMENT<0>, <1>. Similarly the redundant column elements CELEMENT<2>, <3> disposed in the region of memory array MA<1> cross a word line in the normal element region of memory array MA<1>. Note however that the word lines are independent of each other between the both memory arrays MA<0>, MA<1> and do not continue. Accordingly, when more than one defective column within memory array MA<0> is replaced by redundant column elements CELEMENT<2>, <3> on the memory array MA<1> side, since a word line for selection of a cell on a defective column to be replaced and a word line for selection of a spare cell on a defective column element are not common, a need is felt in the case of this embodiment for performing column repair in this way to simultaneously activate the word lines within memory arrays MA<0>, MA<1>.

In contrast, the redundant row elements RELELEMENT<0>, <1> disposed in the region of memory array MA<0> of FIG. 1 cross a column select line for selecting cells arranged in the column direction in the normal element region of memory array MA<0>. Specifically, within memory array MA<0>, the column select line is disposed so that it continuously extends to span the normal element region and regions of redundant row elements RELELEMENT<0>, <1>. Hence, defective word-line replacement within memory array MA<0> by means of these redundant row elements RELELEMENT<0>, <1> is done in a way similar to that of the prior art.

Figure 6:
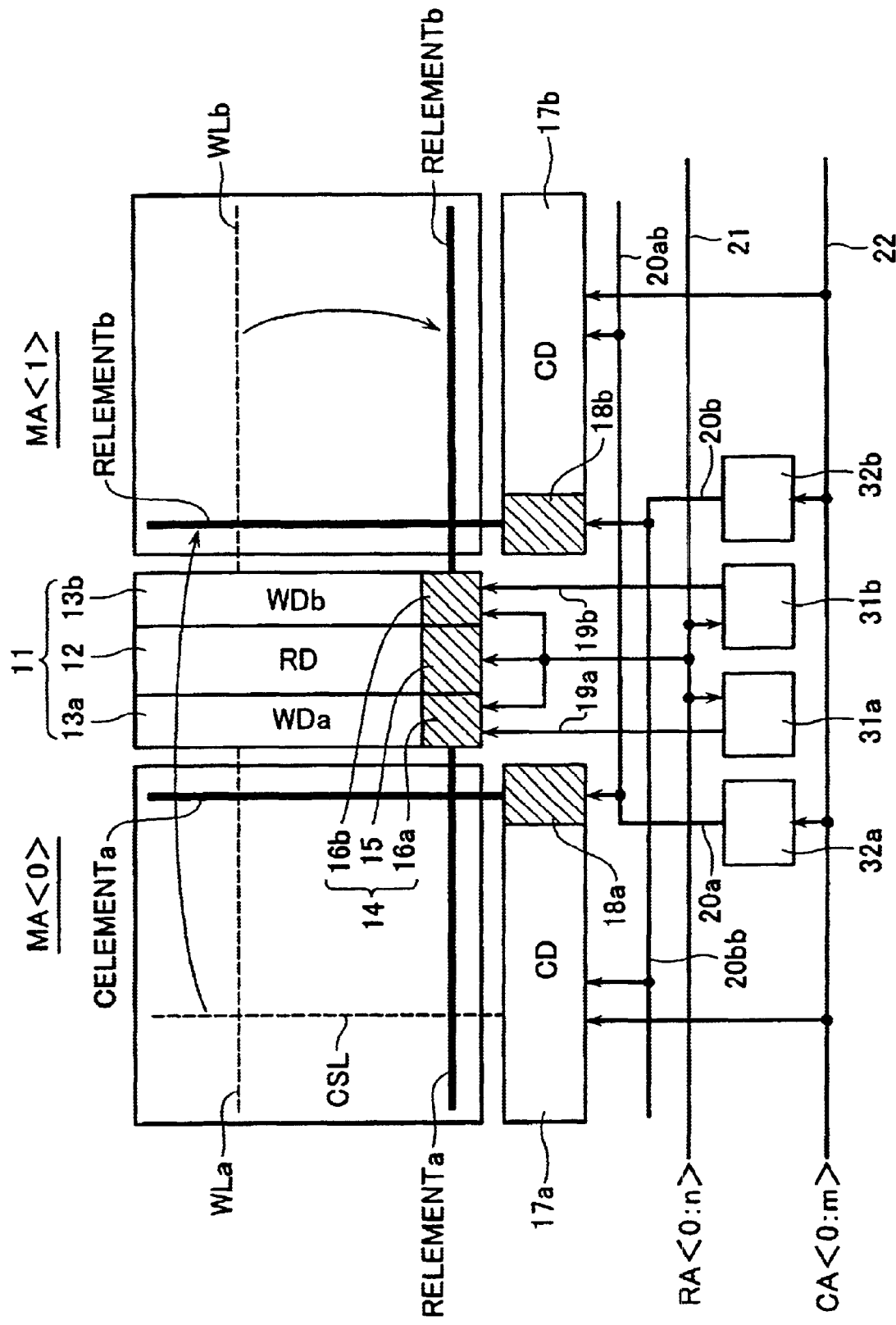
FIG. 6 is a diagram showing a configuration of a replacement control circuit unit in the same embodiment.

An explanation will next be given of a practically implemented defective row/column replacement control scheme in Embodiment 1 with reference to FIG. 6. For explanation facilitation purposes, FIG. 6 depicts an example in which four redundant elements are laid out in two neighboring memory arrays MA<0>, MA<1> in such a manner that a redundant row element RELEMENTa and a redundant column element CELEMENTa belong to memory array MA<0>, whereas a redundant row element RELEMENTb and redundant column element CELEMENTb belong to memory array MA<1>. Practically, the redundant row elements RELEMENTa, RELEMENTb in the memory arrays MA<0>, <1> are such that the entirety of a memory array with the respective elements disposed therein is assigned as a row repair region. On the other hand, the redundant column element CELEMENTa on the memory array MA<0> side is assigned to the memory array MA<1> such that the entire memory array MA<1> becomes a column repair region. Similarly, the redundant column element CELEMENTb on the memory array MA<1> side is assigned to the memory array MA<0> such that the entire memory array MA<0> becomes a column repair region.

A row decoder/word line driver 11 is commonly shared by two memory arrays MA<0>, MA<1> for simultaneous activating normal row elements (word lines) which includes at least one element that belongs to the memory array MA<0> and at least one belonging to the memory array MA<1>. Note here that in case a to-be-activated normal row element of either one of the memory arrays MA<0>, MA<1> contains therein a defect or fault, in order to replace this by an appropriate redundant row element, it is possibly made inactive in a way independent of the other normal row element. More practically, while a decode unit 12 of row decoder 11 is commonly shared by two memory arrays MA<0>, MA<1>, word-line driver units 13a, 13b are provided in units of respective memory arrays MA<0>, MA<1> and are designed so that these are capable of being under activation/inactivation control independently of each other. It should be appreciated that one row element may include only one word line, or may include multiple word lines.

A redundant row decoder 14 is provided for selection of a redundant row element RELEMENT in place of a defective row normal element upon inputting of the address of a defective row. The redundant row decoder 14 also has a decode unit 15 which is shared by two memory arrays MA<0>, MA<1> and word-line driver units 16a, 16b which are provided in units of memory arrays MA<0>, MA<1> and are active/inactive-controllable independently of each other. However, such a case is available that redundant row decoders are provided for two memory arrays MA<0>, <1>, respectively.

Column decoders 17a, 17b are provided to select normal column elements (column select lines) of the memory arrays MA<0>, MA<1> in response to receipt of column addresses respectively. Redundant column decoders 18a, 18b are provided, each of which is for selection of a redundant column element CELEMENT in place of a defective normal column element upon input of a defective column address.

Generally a single column select line is for simultaneous selection of a plurality of bit line pairs and for controlling parallel transmission of multiple data items. But, this is not a limitative one. Optionally, in view of the fact that word lines of two memory arrays MA<0>, MA<1> are activated simultaneously, it is also possible to perform data transfer in units of multiple bits in the both memory arrays MA<0>, MA<1> at a time. In some cases, the normal column elements may be bit lines or data lines to which bit lines are selectively connected rather than column select lines. One column element may have plural column select lines or plural data lines.

For use as replacement control circuitry for performing row/column replacement control, row replacement control circuits 31a, 31b and column replacement control circuits 32a, 32b are disposed. These replacement control circuits are made up of defective address storage circuitry with a defective address or addresses programmed therein and address comparison circuitry for performing coincidence or "matching" detection of a defective address being presently held in this defective address storage circuitry and an externally supplied row/column address. Practically the defective address storage circuitry is configured from a fuse set employing fuse elements corresponding to a plurality of addresses and a fuse data latch circuit operable to read such fuse data when power-on and then store the data therein.

To perform this address comparison, row address data RA<0:n> is transferred over a row address signal bus 21 and supplied to the row decoder 11 and simultaneously supplied also to the row replacement control circuits 31a, 31b. Similarly column address data CA<0:m> is sent via a column address signal bus 22 and then supplied to the column decoders 17a, 17b and simultaneously supplied to the column replacement control circuits 32a, 32b. Upon inputting of a defective row address, the row replacement control circuits 31a, 31b output row replacement control signals 19a, 19b, respectively. These row replacement control signals 19a, 19b are used to activate the redundant row decoder 14 while at the same time letting a row decoder 11 corresponding to the input row address be made inactive.

An important feature of this embodiment lies in that although one normal row element in the memory array MA<0> and one normal row element in memory array MA<1> are selected simultaneously, such simultaneously selected two normal row elements are subject to replacement control independently of each other in regard to defective row replacement. More specifically as exemplarily shown in FIG. 6, in the event that a word line WLb on the memory array MA<1> side, for example, of normal row elements (word lines WLa, WLb indicated by broken lines) which are simultaneously selected within the memory arrays MA<0>, <1> is found to be defective, replacement control is performed to activate as an alternative thereto the redundant row element RELEMENTb (spare word line) within the same memory array MA<1>.

In this way, the control for replacement of only either one of the word lines WLa, WLb as simultaneously selected in the memory arrays MA<0>, <1> is enabled by specifically programming two row replacement control circuits 31a, 31b in such a way as to output row replacement control signals 19a, 19b in response to different row addresses.

When a defective column address is input, the column replacement control circuits 32a, 32b output column replacement control signals 20a, 20b. These signals 20a, 20b are for activating redundant column decoders 18a, 18b respectively and simultaneously inactivating column decoder 17a, 17b corresponding to the input defective column address. With this embodiment, let a normal column element found defective within the memory array MA<0> be replaced by the redundant column element CELEMENTb within memory array MA<1> while replacing a defective normal column element within memory array MA<1> with the redundant column element CELEMENTa in memory array MA<0> in the way stated supra.

Thus the column replacement control signal 20a as output from one column replacement control circuit 32a is supplied as an activation signal to the redundant column decoder 18a of memory array MA<0> and, simultaneously supplied as a disable signal 20ab to the column decoder 17b on the memory array MA<1> side. The column replacement control signal 20b as output from the other column replacement control circuit 32b is supplied as an activation signal to the redundant column decoder 18b of memory array MA<1> and simultaneously sent as a disable signal 20bb to the column decoder 17a on the memory array MA<0> side. In FIG. 6, there is shown an example which permits the memory array MA<0> side defective normal column element (column select line CSL indicated by dotted line) is replaced by redundant column element CELEMENTb on the memory array MA<1> side.

A plurality of redundant row elements may also be disposed in a respective one of the memory arrays MA<0>, <1>. In such case also, redundant row decoders are disposed in units of respective redundant row elements, with row replacement control circuits provided on a per-element basis. Defective row address information of a range defined as a row relief region by means of respective redundant row elements may be programmed in each row replacement control circuit. With such an arrangement, it is possible to generate any required row replacement control signal(s) in accordance with a defective row address(es) in a similar way to that of the example stated above.

Figure 7:
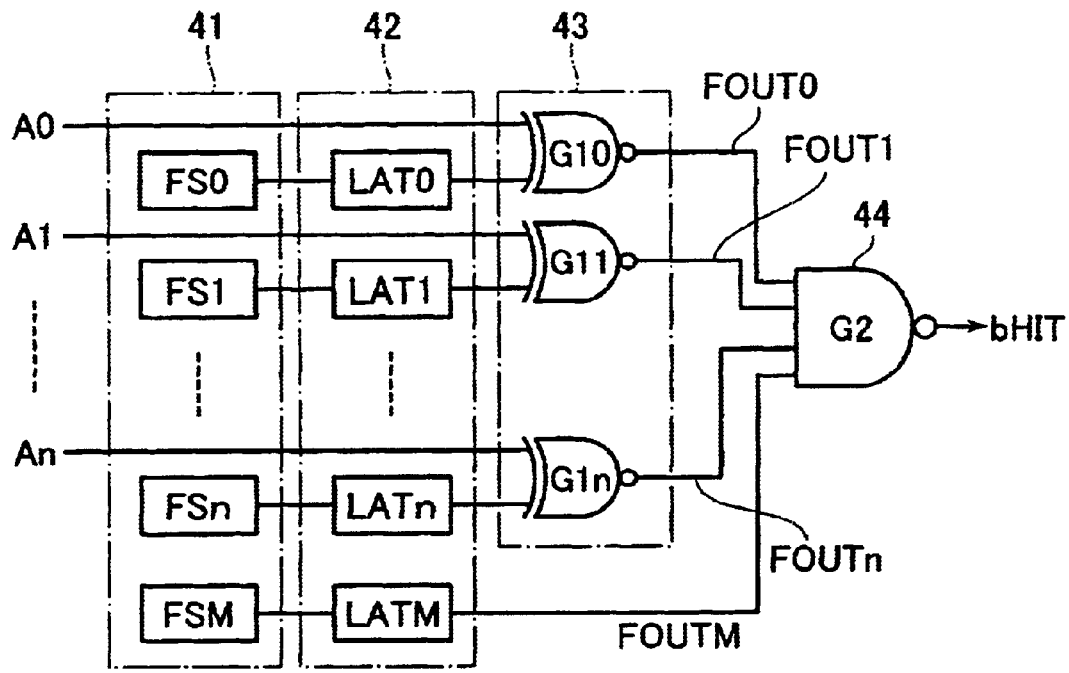
FIG. 7 is a diagram showing a practically implemented configuration example of the replacement control circuit of FIG. 6.

FIG. 7 shows a practically implemented configuration example of the replacement control circuits 31a, 31b, 32a, 32b in FIG. 6. As shown herein, the replacement control circuitry has a fuse set 41 with a plurality of defect address-programmable fuse elements FSi (where "i" is 0, 1, 2, . . . , n), a fuse data latch circuit 42 that consists essentially of latches LATi for storing therein read data of each fuse FSi, and an address comparing circuit 43 for comparison of the stored fuse data with an address Ai. The address comparator circuit 43 is constituted from Exclusive-OR ("Ex-OR") logic gates Gli. A comparison output FOUTi of each Ex-OR gate indicative of a fuse data to address bit comparison result is passed to a coincidence detection circuit 44 formed of a NAND gate G2, which then performs coincidence or "matching" detection thereof. Whereby, when an input address matches a presently stored defect address, a "hit" signal bHIT is output. This hit signal bHIT corresponds to the row/column replacement control signal 19a, 19b, 20a, 20b as previously discussed in conjunction with FIG. 6.

The fuse set 41 includes a "master" fuse (enable fuse) FSM in addition of the fuses FSi for defect address storage. This master fuse FSM is the one that sets up the fuse set 41 into its enable state for the first time when fuse set 41 is programmed to thereby ensure that the hit signal bHIT is hardly output from fuse set 41 prior to programming thereof. Data of this master fuse FSM also is read out into a latch LATM and held therein, an output signal of which latch is supplied as an enable signal FOUTM to the coincidence detector circuit 44.

Figure 8:
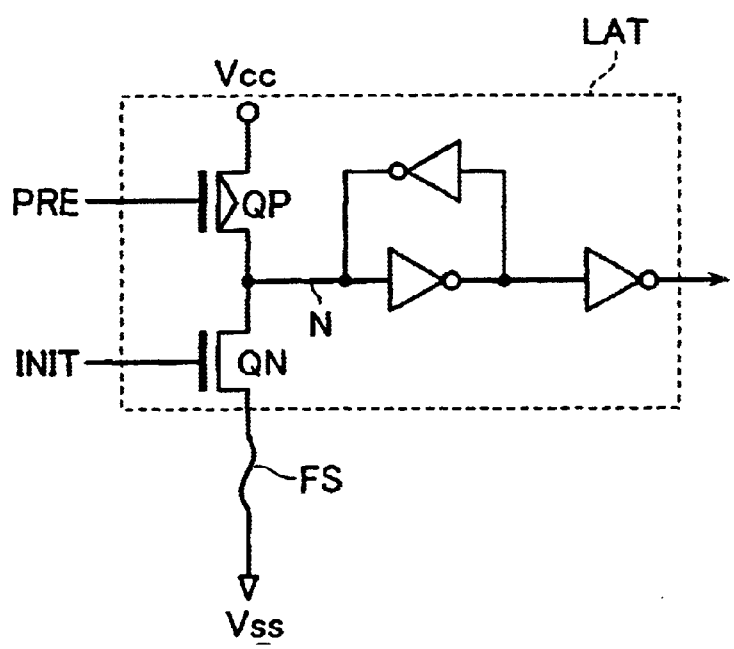
FIG. 8 is a diagram showing a configuration of one fuse data latch circuit in the replacement control circuit.

FIG. 8 shows an exemplary configuration of one latch LAT of the fuse data latch circuit 42. A fuse FS is serially connected between a power supply terminal Vcc and a ground terminal Vss, along with a read-use N-channel metal oxide semiconductor (NMOS) transistor QN and a P-channel MOS (PMOS) transistor QP for use as a precharger. Upon power-on, a precharge signal PRE retains a "Low" or "L" level for a prespecified length of time period; thereafter, it potentially rises up to reach "High" ("H") level. Meanwhile, the NMOS transistor QN is kept nonconductive, i.e. turned off, causing a node N to be precharged at "H" level by PMOS transistor QP. After PMOS transistor QP is turned off, a readout signal INIT becomes "H" causing NMOS transistor QN to turn on. If fuse FS is cut then node N holds "H"; if fuse FS is not cut then electrical charge of node N is discharged through fuse FS, thus becoming "L." Whereby, fuse data is read and latched.

Embodiment 2

A second embodiment of the invention is an extended version of Embodiment 1 stated above, which also permits redundant row and column elements being assigned to row and column repair regions having an overlap region to cross or intersect each other. This can be said to be one that combines together the redundancy scheme of Embodiment 1 and a prior art redundancy scheme.

In other words, with Embodiment 2, multiple redundant row (or column) elements are provided with respect to a single overlap region for use as the redundant row (or column) element to be assigned to an overlap region of row and column repair regions. And, part of these multiple redundant row (or column) elements intersects a redundant column (or row) element being assigned to such overlap region with the remaining part thereof being prevented from crossing.

A detailed explanation will be given by using FIG. 1. Suppose that a redundant row element EELEMENT<1> is assigned to an upper half row repair region RRA<1> of the left-side memory array MA<0>. At this time, not only the element CELEMENT<2> or CELEMENT<3> on the memory array MA<1> side but also the element CELEMENT<0> or <1> on the memory array MA<0> side may be used as the redundant column element to be allocated to the left half column repair region CRA<2> of the left-side memory array MA<0>.

At this time, although the redundant row element RELEMENT<1> which corresponds to an overlap region of row/column repair regions RRA<1>, CRA<2> and the redundant column elements CELEMENT<2>, CELEMENT<3> do not mutually intersect, RELEMENT<1> and redundant column elements CELEMENT<0>, <1> intersect together. To be brief, the redundant row element RELELEMENT<1> and the redundant column elements CELEMENT<0>, <1> have cells (called "limbo" cells) simultaneously selectable by a continuing spare word line, by way of example.

In accordance with this embodiment, it is possible to further increase the number of redundancy elements with respect to a certain repair region so that it is greater than that of Embodiment 1. A replacement control scheme as employed therein is the same in principle as that of the prior embodiment shown in FIG. 6. More specifically, control for replacement of a defective row relative to normal row elements to be simultaneously activated in two memory arrays MA<0>, <1> is done independently in the memory arrays MA<0>, <1>. Note here that in FIG. 6, there is shown an example in which a redundant column element disposed in one memory array lets the other memory array be a column repair region. Accordingly, signal lines of disable signals 20ab, 20bb from the column replacement control circuits 32a, 32b are provided only in one memory array side.

In contrast thereto, Embodiment 2 is such that the normal column element disposed in one memory array lets the other memory array other than a memory array with this element disposed therein be a column repair region. Thus with this embodiment, it is required that the signal lines of disable signals 20ab, 20bb as output from the column replacement control circuits 32a, 32b shown in FIG. 6 be provided to span both of the memory arrays MA<0>, <1>.

Embodiment 3

A third embodiment is arranged so that for use as the redundant column (or row) element which does not intersect a redundant row (or column) element corresponding to a certain overlap region, a specific one is selected which intersects a redundant row (or column) element (or normal row or column element) corresponding to another row (column) repair region adjacent to the row (column) repair region which forms such overlap region together with the column (row) repair region.

FIG. 9 is one example for explanation of Embodiment 3, wherein four memory arrays MA<0> to MA<3> are disposed. Two memory arrays MA<0>, <1> are in close proximity in position to each other while commonly sharing a row-decoder/word-line driver (RD&WD) which is interposed between them; similarly, the remaining two memory arrays MA<2>, <3> are adjacent to each other while sharing a row-decoder/wordline driver (RD&WD) laid therebetween. The two memory arrays MA<0>, <1> are to be made active simultaneously; further, the other two memory arrays MA<2>, <3> are also activated simultaneously.

In a respective one of the memory arrays MA<0> to <3>, redundant row elements RELELEMENT<0> to <3> and redundant column elements CELEMENT<0>-<3> are disposed. Each of the memory arrays MA<0>-<3> is a row repair region, and is also a single column repair region. In brief, this example is one that has an overlap region with complete coincidence of the row repair region and column repair region.

When looking at the memory array MA<0>, the redundant row element RELELEMENT<0> as disposed in a region of the memory array MA<0> is employed for repairing a defective row of the memory array MA<0>; the redundant column element CELEMENT<1> disposed in its neighboring memory array MA<1> is sued for defective column repair. Accordingly the redundant row element and redundant column element corresponding to the memory array MA<0> that is an overlap region of the row repair region and column repair region do not intersect each other.

Similarly, when looking at the memory array MA<1>, the redundant row element RELELEMENT<1> as disposed in the memory array MA<1> is used for defective row repair thereof whereas the redundant column element CELEMENT<0> disposed in its neighboring memory array MA<0> is used for defective column repair. Thus in this case also, the redundant row element and redundant column element corresponding to the memory array MA<1> that is an overlap region do not cross each other.

Between the memory arrays MA<2> and MA<3> also, redundancy elements and their repair regions are set with a similar relationship.

A feature of this embodiment as to column defect repair of the memory array MA<0> is that while there are redundant column elements CELEMENT<1>, <2>, <3> for use as the ones that do not intersect the redundant row element RELELEMENT<0> used for defective row repair of memory array MA<0>, the redundant column element CELEMENT<1> which is disposed in the memory array MA<1> that is the nearest to a to-be-replaced one of these memory arrays, i.e. the memory array MA<0>. Performing such replacement control makes it possible to shorten on-chip wire leads for transmission of control signals from replacement control circuitry.

This point will be explained in detail below. For each redundant column element, a replacement control circuit RCTR is provided as shown in FIG. 9. As has been stated in conjunction with FIG. 6, the replacement control circuit RCTR has an address storage circuit such as a fuse circuit or else for storing therein more than one defect address and an address comparator circuit which performs coincidence detection of an externally supplied address and a defect address being presently stored in the address storage circuit. Owing to this replacement control circuit RCTR, when the defect address is accessed, a replacement control signal is output for inactivating a decode unit corresponding to the defect address while activating a spare decode unit corresponding to an "alternative" redundancy element in place thereof.

As shown in detail in FIG. 9, when a defective column of the memory array MA<0> is accessed, the replacement control circuit RCTR existing near the memory array MA<1> activates the redundant column element CELEMENT<1> and issues a disable signal DIS for inactivation of the defective column of memory array MA<0>. With this embodiment, it is possible to minimize the length of a wire lead for transfer of this disable signal DIS. Thus it becomes possible to establish a high-speed redundancy system; further, it is possible to minimize a disable signal transfer lead wiring area, which in turn makes it possible to minimize the area of a redundancy circuit unit, thus enabling shrinkage of chip area.

In the above-stated example of defective column repair of the memory array MA<0>, if CELEMENT<2>, <3> disposed in the memory arrays MA<2>, MA<3> at distant locations are selected as redundant column elements, then a disable signal must be supplied via a lead wire extending from the control circuit RCTR for activation of these elements up to the region of memory array MA<0>. The result is that a defective normal column element disabling operation can delay due to affection of such "online" delay. In addition, if the disable signal transfer line increases in length then the resulting on-chip occupation area thereof increases accordingly, which would result in a likewise increase in area of the replacement control circuit unit, leading to an unwanted increase in chip size.

Embodiment 3 is modifiable to use, as the redundant row element corresponding to the memory array MA<0> that is an overlap region, CELEMENT<1> of the neighboring memory array MA<1> and further use CELEMENT<2> and <3> of memory arrays MA<2>, MA<3> continuing thereto. Obviously in this case, the use of the redundant column elements CELEMENT<2>, <3> of memory arrays MA<2>, <3> for repair of the memory array MA<0> requires that normal elements within these memory arrays or redundant row elements which have replaced them be activated simultaneously.

In brief, it is possible to select, as a redundant column (or row) element which does not intersect a redundant row (or column) element corresponding to an overlap region, any one of a plurality of redundant column (row) elements crossing the redundant row (column) elements (or normal elements), which respectively correspond to a plurality of row (column) repair regions continuing with the row (column) repair region forming such the overlap region, may be selected.

In this case also, as the plurality of row (or column) repair regions are not significantly spaced apart from one another in a physical sense, it is possible to suppress the length of an on-chip lead for transfer of a disable signal for inactivation of a defective normal element, thus enabling achievement of the intended redundancy system capable of operating at high speeds.

In this embodiment also, with regard to the normal row elements being simultaneously activated in the memory arrays MA<0>, MA<1>, defective row replacement control is performed in memory arrays MA<0>, <1> in a way independent of each other. Similarly, for the normal row elements to be simultaneously activated in the memory arrays MA<2>, MA<3>, defective row replacement control is done in memory arrays MA<2>, <3> independently of each other. A replacement control scheme of them is similar to that of Embodiments 1, 2.

It should be noted that in this embodiment, a row repair region which is adjacent to the row repair region forming the overlap region or alternatively continues thereto takes, in many cases, a form in which these neighbor each other with the row-decoder/wordline driver interposed therebetween as shown in FIG. 9 or alternatively a form in which a subwordline driver is interposed in case word lines are designed to have a hierarchical structure of main word lines and sub-word lines. Similarly a column repair region which is adjacent to the column repair region forming the overlap region or alternatively continues thereto takes in many cases a form in which these neighbor each other with the row-decoder/wordline driver—a sub-column select line driver, in the case of a hierarchical column select line structure—interposed therebetween.

Embodiment 4

With a fourth embodiment of this invention, its unique feature is that it includes one in which a redundant row element corresponding to an overlap region and a redundant column element corresponding to the same overlap region do not intersect each other, wherein a column (or row) repair region which forms such overlap region is part of a memory chip with repair efficiency in the column (or row) repair region being made equal to that in the remaining column (row) repair regions.

Figure 10:
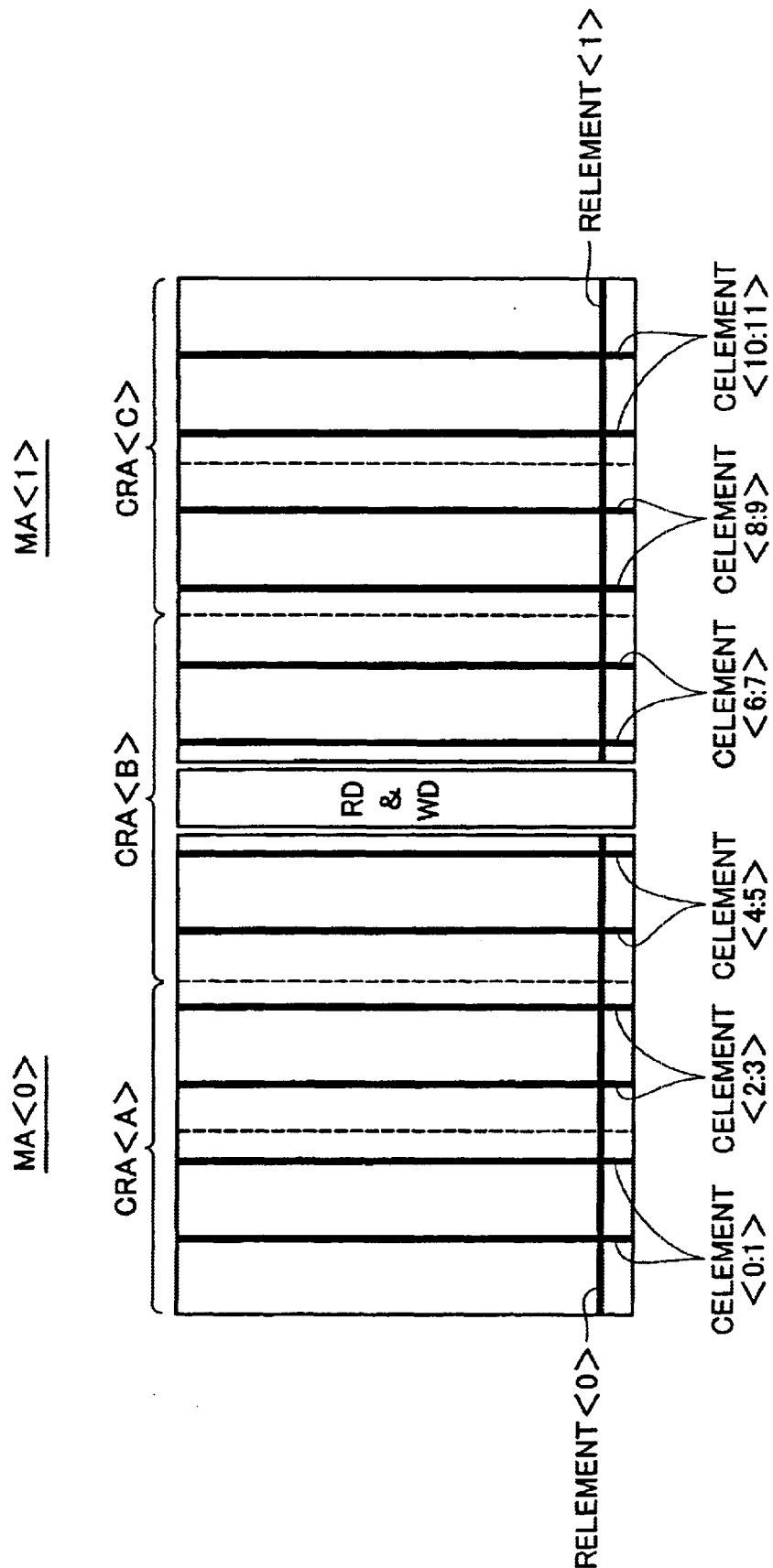
FIG. 10 is a diagram showing a redundancy system of a semiconductor memory in accordance with a fourth embodiment of this invention.

In most semiconductor memories, the requisite numbers of respective repair regions and redundancy elements relating thereto are determined based on prediction of a distribution of defects or faults on a memory chip. As shown in FIG. 10, the memory chip is typically configured from a plurality of memory arrays (only two, MA<0> and MA<1>, of them are depicted herein) each having a storage capacity C [Mbits]. Suppose that row repair regions defined by the redundant row elements RELELEMENT<0>, RELEMENT<1> equipped in each memory array are memory arrays MA<0>, MA<1>, respectively.

Now assume from defect distribution prediction that four redundant column elements are required with respect to a column repair region with a capacity ($\frac{2}{3}$)C [Mbits] in order to obtain the required column repair efficiency. In the case of FIG. 10, four redundant column elements CELEMENT<0:1>, <2:3> are equipped in a column repair region CRA<A> which is a region that is $\frac{2}{3}$ of the memory array MA<0>; similarly, four redundant column elements CELEMENT<8:9>, <10:11> are in a column repair region CRA<C> which is a region that is $\frac{2}{3}$ of the memory array MA<1>. At this time, a problem to be solved at this time is how many redundancy elements are equipped in the remainder region of $\frac{1}{3}$ of memory array MA<0>, <1>.

If the remainder memory regions of capacity ($\frac{1}{3}$)C [Mbits] are used as column repair regions respectively while letting two redundant column elements be disposed in each of them, then the repair efficiency relative to these column repair regions becomes lower than that relative to column repair region CRA<A>, <C> with four redundant column elements per ($\frac{2}{3}$)C [Mbits]. This occurs because the greater the repair region, the higher the repair efficiency under an assumption that a redundancy element number per unit capacity is kept constant. And, if only a partial repair region of the chip is lower in repair efficiency than the other repair regions then the chip would likewise decrease in production yield as a whole.

One available approach to enhancement of the repair efficiency is to let the column repair region with its capacity of ($\frac{1}{3}$)C [Mbits] comprise more than three redundant column elements. Unfortunately this approach is encountered with risks which follow: an excessive increase in repair efficiency only in the column repair region of capacity ($\frac{1}{3}$)C [Mbits], and an increase in redundancy element number per unit capacity, which would lead to an increase in chip area. Also note that in view of the fact that most memory arrays are typically designed by employing repeated layout of a plurality of sub-arrays of the same capacity while disposing the same number of redundancy elements within each sub-array, locally increasing in number the redundancy elements for certain sub-arrays only results in an increase in complexities of chip layout and circuit configuration of resultant array module, which can lead to a decrease in performance and/or an increase in chip area.

To avoid this, in Embodiment 4, as shown in FIG. 10, two redundant column elements are provided for the remainder ⅓ region of each memory array while letting two (⅓)C [Mbits] capacity regions in the neighboring memory arrays MA<0>, MA<1> be combined together into a single column repair region CRA<B>. Redundant column elements with respect to the resultant combined column repair region CRA<B> with a capacity of (⅔)C [Mbits] are four elements of CELEMENT<4:7>.

In this case, with regard to an overlap region of the memory array MA<0> that is a single row repair region and the column repair region CRA<B>, when looking at a relationship of a redundant row element RELELEMENT<0> corresponding to this overlap region versus redundant column elements CELEMENT<4:7> corresponding to the same overlap region, CELEMENT<4:5> which are part of the redundant column elements CELEMENT<4:7> intersect the redundant row element RELELEMENT<0>; however, CELEMENT<6:7> which are part of the other do not cross the redundant row element RELELEMENT<0>. Accordingly, it is understandable that this embodiment is a modified version of Embodiment 2 stated supra in light of the fact that there coexist a case of using a redundant row element and a redundant column element which do not cross each other with respect to an overlap region, and a case of using mutually crossed redundant row element and redundant column element.

Additionally, the row repair region MA<0> defined by the redundant row element RELEMENT<0> in the memory array MA<0> and the column repair region CRA<B> within the memory array MA<1> based on the redundant column elements CELEMENT<6:7> in the memory array MA<1> have an overlap region, and the redundant column elements CELEMENT<6:7> do not intersect the redundant row element RELEMENT<1> on the memory array MA<0> side but cross the redundant row element RELEMENT<1> on the neighboring memory array MA<1> side. Therefore, the row repair region MA<0> corresponding to the redundant row element RELEMENT<0> and the row repair region MA<1> corresponding to the redundant row element RELEMENT<1> are neighbored with each other. This is also a modification of Embodiment 3.

In addition, when looking at an overlap region of the row repair region MA<0> and the column repair region CRA<B>, a region other than the overlap region is present within the row repair region, whereas a region other than the overlap region exists within the column repair region; thus, this is a form with its row and column repair regions being partially overlapped as has been explained in conjunction with Embodiment 1.

In this way, with the embodiment of FIG. 10, it can be seen that the redundant column elements CELEMENT<4:7> corresponding to an overlap region include CELEMENT<6:7> which do not mutually intersect the redundant row element RELEMENT<0> corresponding to the same overlap region and also that the column repair region CRA<B> which forms such overlap region is part of the memory chip. And it would be understood that since four redundancy elements are prepared with respect to the capacity (⅔)C [Mbits] for relief of a column defect in this column repair region CRA<B>, the repair efficiency thereof stays equal to that in the other column repair regions CRA<A>, <C>.

Consequently with this embodiment, it is possible to uniformly equalize repair efficiencies in all the repair regions on the chip at a sufficient value required, which in turn makes it possible to realize a memory chip with a minimized area while offering increased production yields.

Embodiment 5

A fifth embodiment will next be set forth. This embodiment is arranged so that as for a plurality of row (or column) relief regions present on a memory chip, letting more than one capacity-different repair region be mixed therein makes repair efficiencies in the column (or row) repair regions uniform in value over the entire chip.

Figure 11:
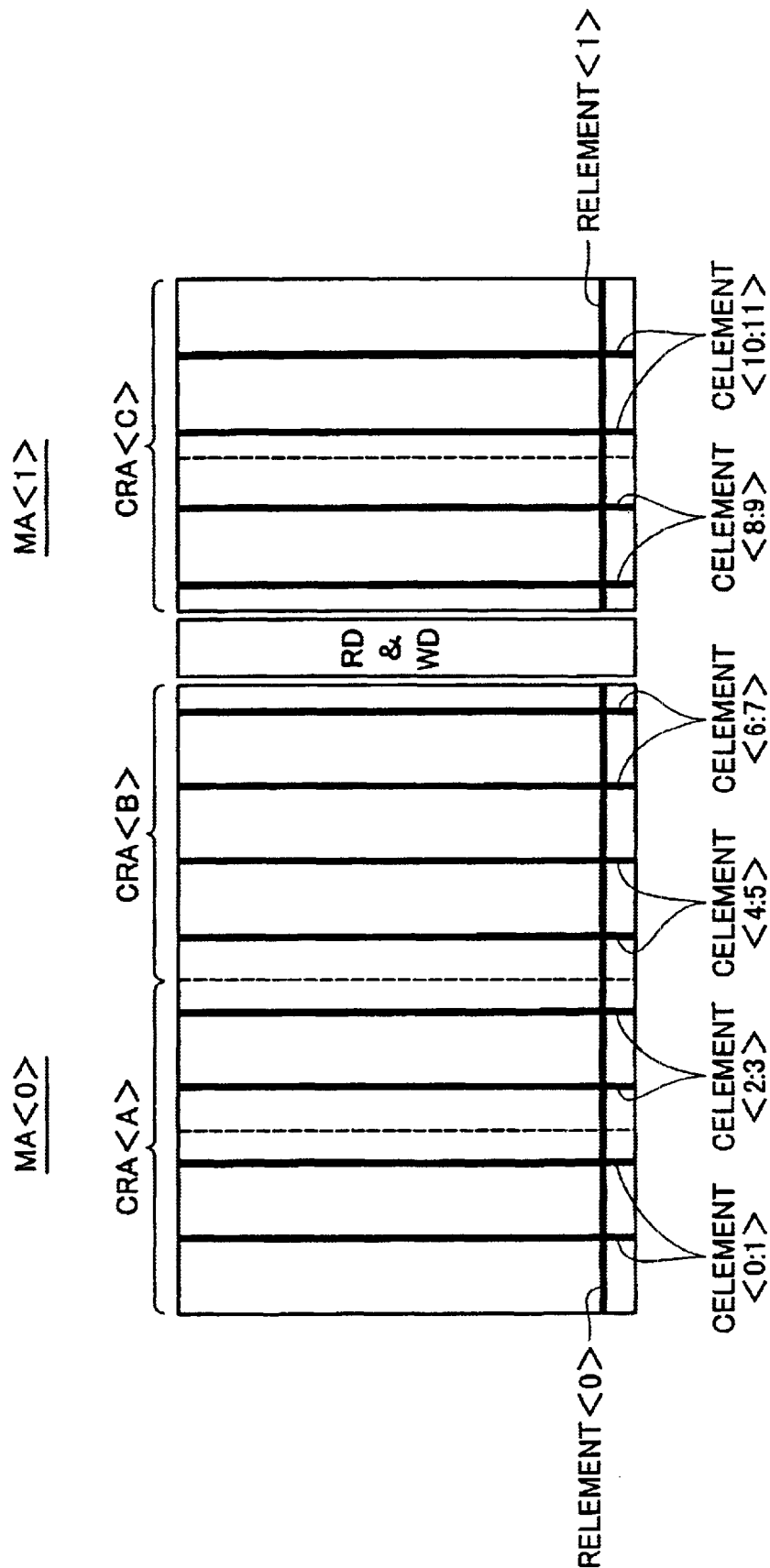
FIG. 11 is a diagram showing a redundancy system of a semiconductor memory in accordance with a fifth embodiment of this invention.

One exemplary memory array configuration of it is shown in FIG. 11. This is the one that moved a region (⅓ capacity portion of the memory array) on the memory array MA<1> side of the column repair region CRA<B> in FIG. 10 toward the memory array MA<0> side. This results in that two column repair regions CRA<A>, <B> are set in one memory array MA<0> while letting a single column repair region CRA<C> be set in the other memory array MA<1>. Thus, the capacity of memory array MA<0> measures (4⁄3)C [Mbits]; the capacity of memory array MA<1> is (⅔)C [Mbits]. Redundant row elements RELEMENT<0>, <1> are provided in a respective one. In short, row repair regions of different capacities coexist on the memory chip.

With this method also, the column redundancy in every column repair region on the memory chip becomes 4 elements with respect to the capacity (⅔)C [Mbits]. Thus it is possible to make uniform or "uniformize" repair efficiencies in all available column repair regions of the memory chip at a sufficient value required, thereby enabling achievement of the intended chip with minimal area and high production yields.

Note however that in this embodiment, on-chip leads of word lines and/or on-chip lead wires such as sense-amplifier control signal transfer lines running in parallel to word lines within sense-amp areas can differ in length. Due to this, careful attention should be paid to row-system circuit designs. In addition, the row repair regions are different in capacity between the memory array MA<0> and memory array MA<1>, resulting in repair efficiencies in row repair regions being different in value. Thus it is preferable to apply in cases where such differences do not affect the repair efficiency of the entire chip.

Embodiment 6

Figure 12:
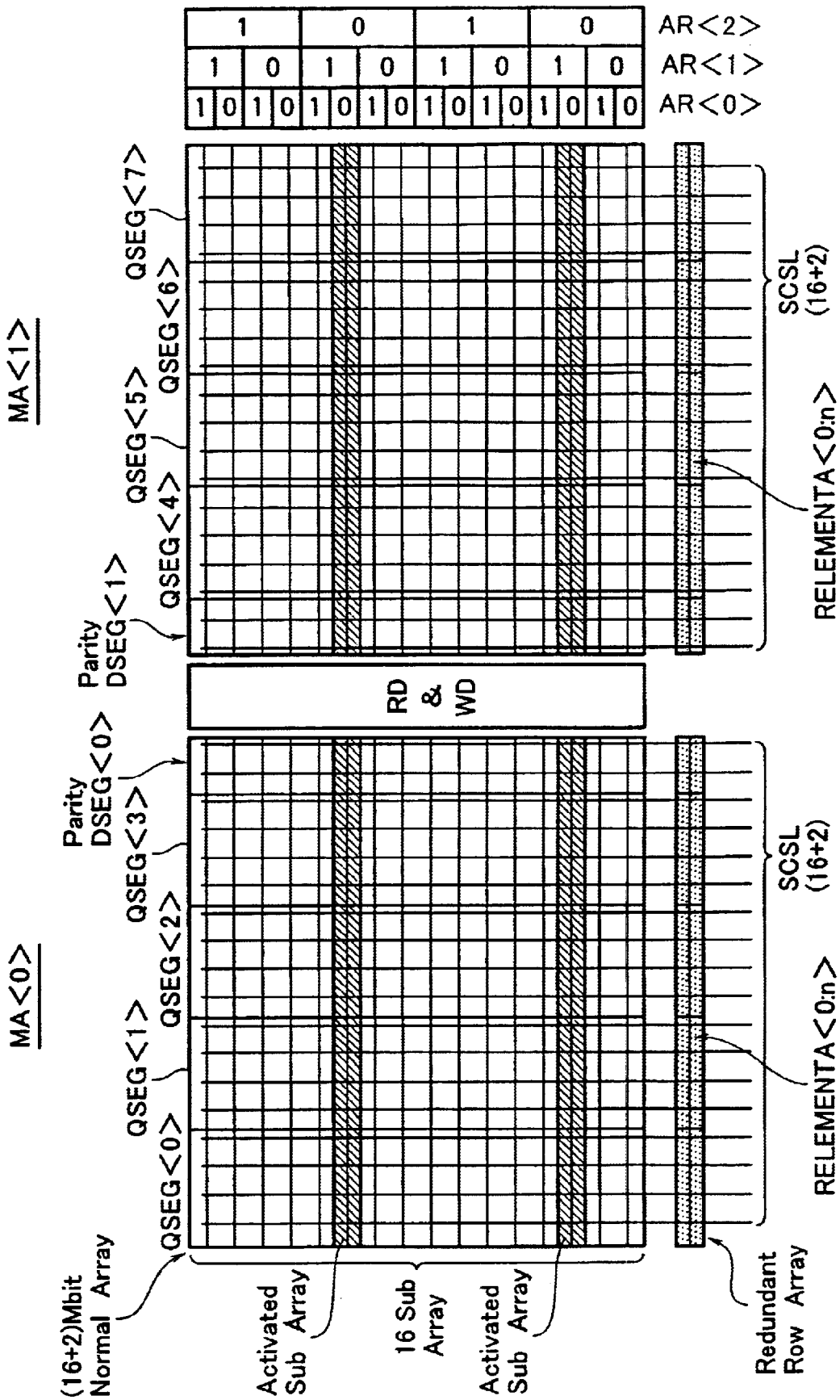
FIG. 12 is a diagram showing a redundancy system of a semiconductor memory in accordance with a sixth embodiment of this invention.

A sixth embodiment shown in FIG. 12 is an example with the above-stated Embodiment 4 applied to a 32-Mbit dynamic random access memory (DRAM) chip. This embodiment is arranged to have redundant elements including a redundant row element corresponding to an overlap region of row and column repair regions and a redundant column element corresponding to the same overlap region which do not intersect each other while letting a column (or row) repair region which is part of a memory chip forming such overlap region be used as a memory cell section used for error checking/correcting use check bits (parity bits). More definitely, the memory arrays MA<0>, MA<1> are designed so that each additionally has in a 16-Mbit normal data area a 2-Mbit parity data area for storage of error checking/correcting parity bits, resulting in establishment of 36-Mbit capacity of the memory chip as a whole.

In the left-side memory array MA<0>, a redundant row array which includes a plurality of redundant row elements RELEMENT<0:n> (n is a natural number) is disposed as a separate array from the normal array. A respective one of the redundant row elements RELEMENT<0:n> is also permitted to replace any one of normal row elements within the memory array MA<0> of 18 Mbits. Accordingly, a row repair region by means of respective ones of the redundant row elements RELEMENT<0:n> is the entirety of the left 18-Mbit memory array MA<0>.

Similarly in the right-side memory array MA<1> also, a redundant row array is laid out, in which multiple redundant row elements RELEMENT<0:n> (n is a natural number) are present. This row repair region by means of the redundant row elements RELEMENT<0:n> also is the entirety of the right 18-Mbit memory array MA<1>.

The scheme with the separate array arranged in this way for redundancy purposes is capable of enhancing replacement efficiency because of its ability to enlarge the repair region by means of redundant elements.

Each memory array MA<0>, <1> is subdivided along a column direction into sixteen subordinate memory ("sub-memory") arrays by more than one sense-amp bank (a region with continuous layout of a plurality of sense amplifiers S/A). Upon inputting of a row address, sub-memory arrays at two locations within each memory array are activated simultaneously as exemplarily indicated by oblique lines in FIG. 12, causing normal row elements each belonging to a sub-array—thus, four normal row elements in total with respect to the entire chip—to be activated simultaneously. The same row address corresponds to these four normal row elements; thus, the right and left normal row elements are replaceable by redundant row elements independently of each other.

Each memory array MA<0>, <1>'s 16-Mbit normal data area and 2-Mbit parity data area are formed of sixteen 1-Mbit segments and two 1-Mbit segments, respectively. Each segment is equipped with a single spare column select line SCSL for redundancy use. In the normal data area, every group or "cluster" of four segments is combined together to constitute a quadruple segment QSEG of 4 Mbits. Thus, four quadruple segments QSEG<0> to <3>, QSEG<4>-<7> are present in each memory arrays MA<0>, <1>. The parity data area is such that two segments are gathered to form a 2-Mbit double segment DSEG, resulting in two double segments ParityDSEG<0>, <1> existing in memory arrays MA<0>, <1>.

When reading data out of this chip, while simultaneously activating four (two from the right memory array and two from the left memory array) normal row elements, simultaneously activate eight (four from each of the right and left memory arrays) column select lines CSL (not depicted) in total, which belong to the quadruple segments QSEG respectively in such a manner that a single line is selected from each segment. Whereby, read 16 m (m is a natural number) bits of data out of the entire chip; and also, activate a single column select line CSL within two parity-use double segments DSEG (Parity DSEG<0>, Parity DSEG<1>) to thereby read 2 m bits parity data. To be brief, m-bit data is read out of every cross point or "intersection" of the simultaneously activated row element and column select line CSL in a one-by-one manner. Such the simultaneous data read/write in the memory arrays MA<0>, <1> becomes available due to that the row elements are simultaneously activated in the memory arrays MA<0>, <1>.

Additionally in the event that a defect within the normal data area's quadruple segment QSEG is relieved by the redundant column element, four spare column select lines SCSL within the quadruple segment QSEG are used; in case a defect in the entirety of two parity double segments DSEG (Parity DSEG<0>, Parity DSEG<1>) is relieved by the redundant column element, four spare lines CSL therein are used.

What must be noticed here is that in this embodiment, the spare column select line SCSL continuously extending within a memory array is subdivided by 3-bit input row addresses AR<0:2> into eight portions, each of which is used as an independent redundant column element. The spare column select line division by row addresses in this way is as a result of consideration as to matters which follow. Once a row element is activated and then a column select line is made active, a cell which is designated by such activated row element and activated column select line is subject to read/write irrespective of whether it is a normal column select line CSL or a spare column select line SCSL. Here, when multiple row elements corresponding to the same row address are activated simultaneously in a memory array, and a spare column select line SCSL is activated in place of a defective normal column select line CSL in response to input of a column address, multiple cells which have been expected to be selected by the defective normal column select line CSL on the simultaneously activated multiple row elements in the memory array fail to undergo read/write; instead, multiple cells being selected by the spare column select line SCSL are to experience read/write.

In this way, the cells on multiple row elements to be activated simultaneously in a memory array are replaced together without fail in any event of replacement by a spare column select line. This is because that the column select lines are continuously formed in each memory array. Thus it is required that spare cells on a plurality of row elements (e.g. word lines) being simultaneously activated, which are simultaneously selectable by use of the same spare column select line and then simultaneously subject to read/write, belong to the same redundant column element. However, spare cells on row elements (word lines) which are not subject to read/write simultaneously are permitted to fail to belong to the same redundant column element.

Figure 13:
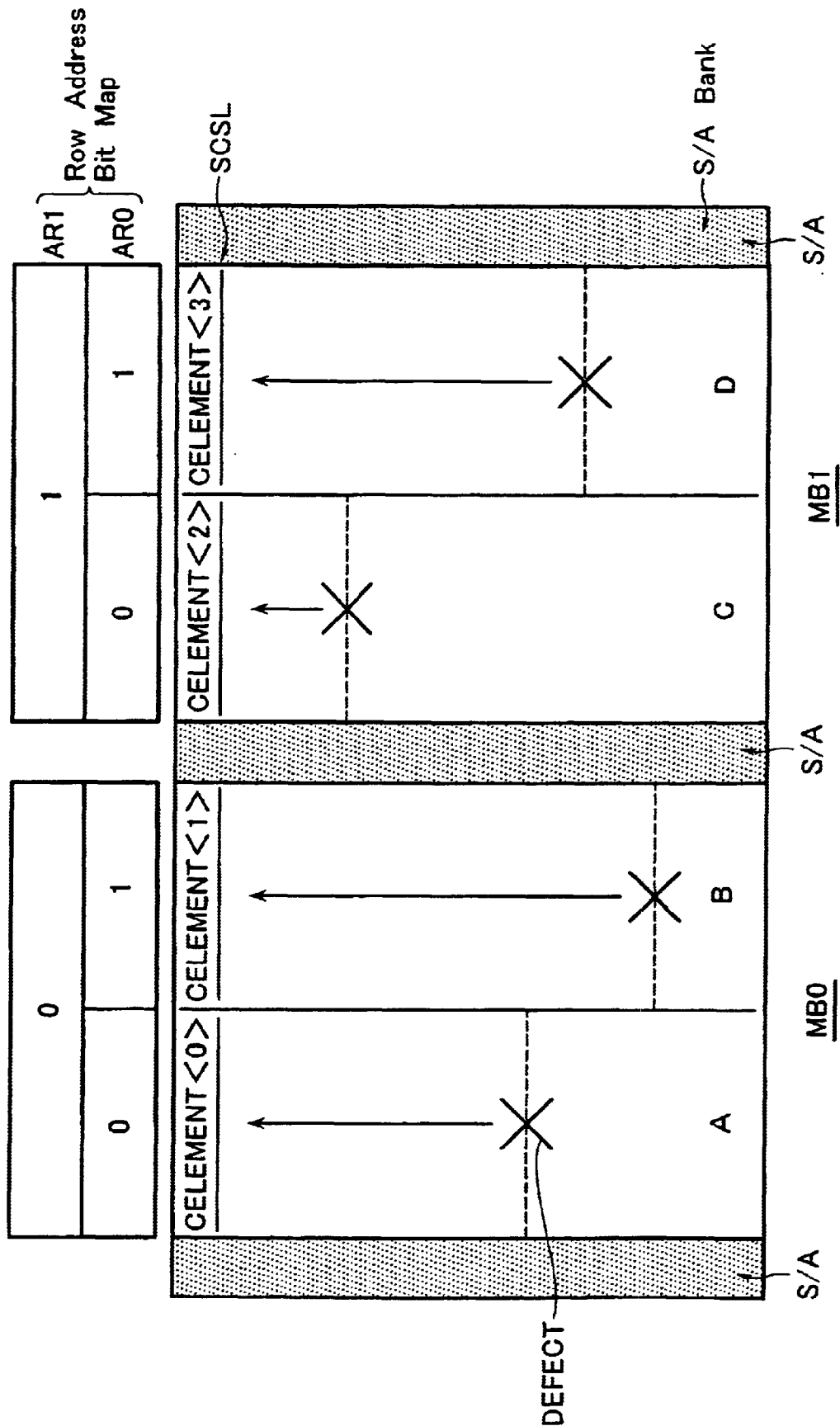
FIG. 13 is a diagram for explanation of a redundant column element setup method in the sixth embodiment.

FIG. 13 shows a way of arranging a plurality of redundant column elements by a single spare column select line through row address allocation to spare column select lines SCSL, with respect to two neighboring sub-arrays (memory blocks) MB0, MB1 which share a sense amplifier. The illustrative subarrays MB0, MB1 are typically subdivided into four regions A, B, C, and D as determined by row addresses AR0, AR1. With shared sense amplifier schemes, it is impossible to simultaneously activate any neighboring subarrays while sharing a sense amp. Now assuming that a row address is input resulting in only one word line being merely activated within this subarray range, the word line to be activated must exist within any one of the regions A to D.

As spare cells on a plurality of row elements (word lines) which are not subject to simultaneous read/write due to the lack of their simultaneous activatability may fail to belong to the same redundant column element, it is possible to categorize the spare cells on spare column select line SCSL into four groups by row addresses AR0, AR1, thus enabling each spare cell group or aggregation to act as an independent redundant column element. With such an arrangement, a single spare column select line SCSL is made up of four redundant column elements CELEMENT<0:3> which are determined by row addresses AR0, AR1. This scheme is capable of increasing redundant elements without having to increase redundant elements; thus, this is a redundancy system excellent in area efficiency.

If fuse sets correspond to redundancy column elements CELEMENT<0:3>, respectively (although it is not always necessary that these are in a one-to-one correspondence manner), then each redundant column element of CELEMENT<0:3> is programmable in such a way as to replace a different column address. If all column addresses of this memory array are programmable in each fuse set, it becomes possible for CELEMENT<0:3> to replace all defective cells of the regions A, B, C and D, respectively. In short, column repair regions by means of CELEMENT<0:3> are A to D respectively.

Additionally in view of the fact that spare cells on a plurality of row elements (word lines) being simultaneously activated in a memory array, which cells are subject simultaneously to read/write by use of the same spare column select line, belong to the same redundant element, such the row elements (wordlines) to be simultaneously activated and then subject to simultaneous read/write must exist within the same row repair region.

Figure 14:
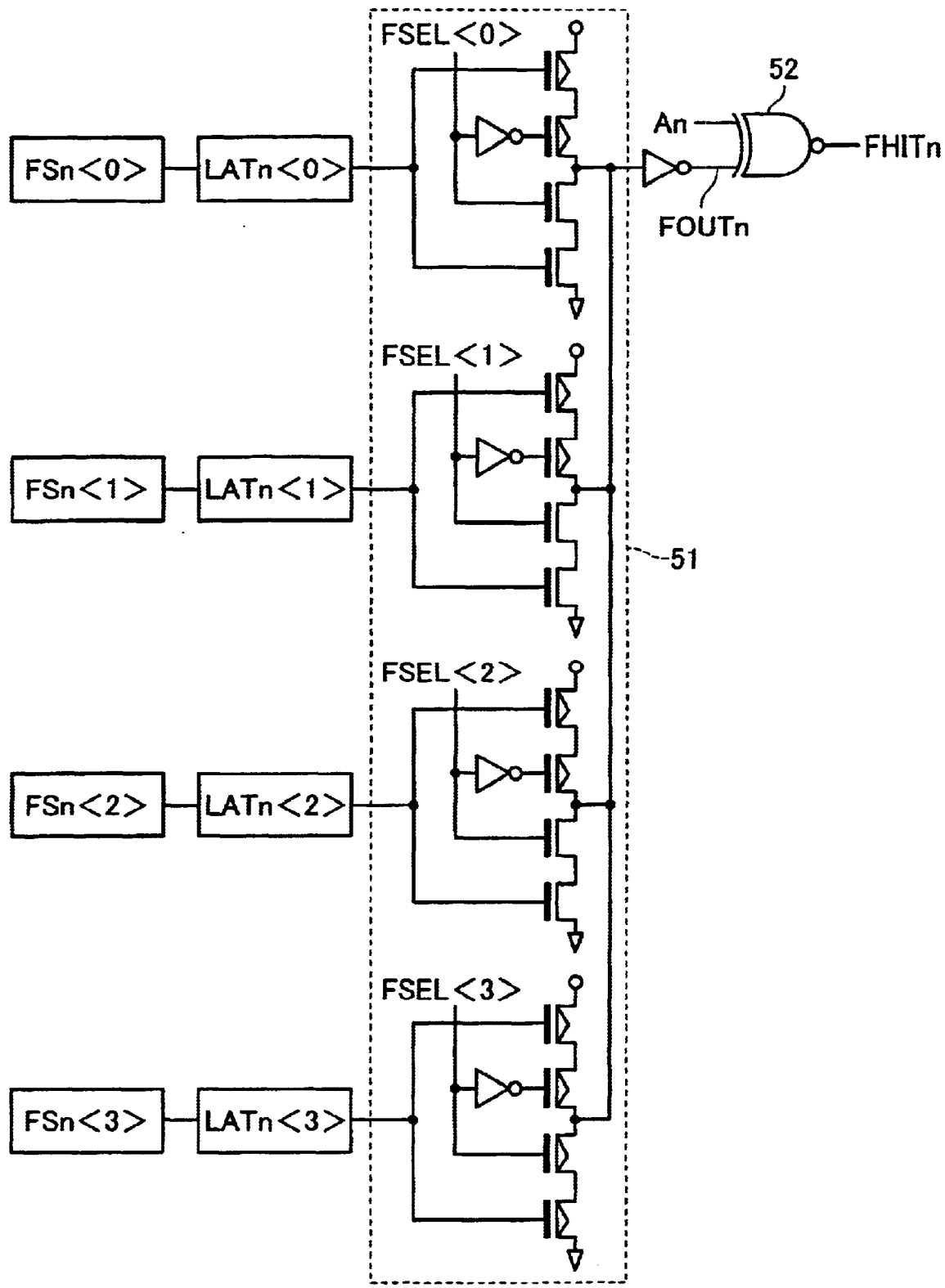
FIG. 14 is a diagram showing an arrangement of fuse set circuitry employable in the case of spare column select line quadrisection utilization.
Figure 15:
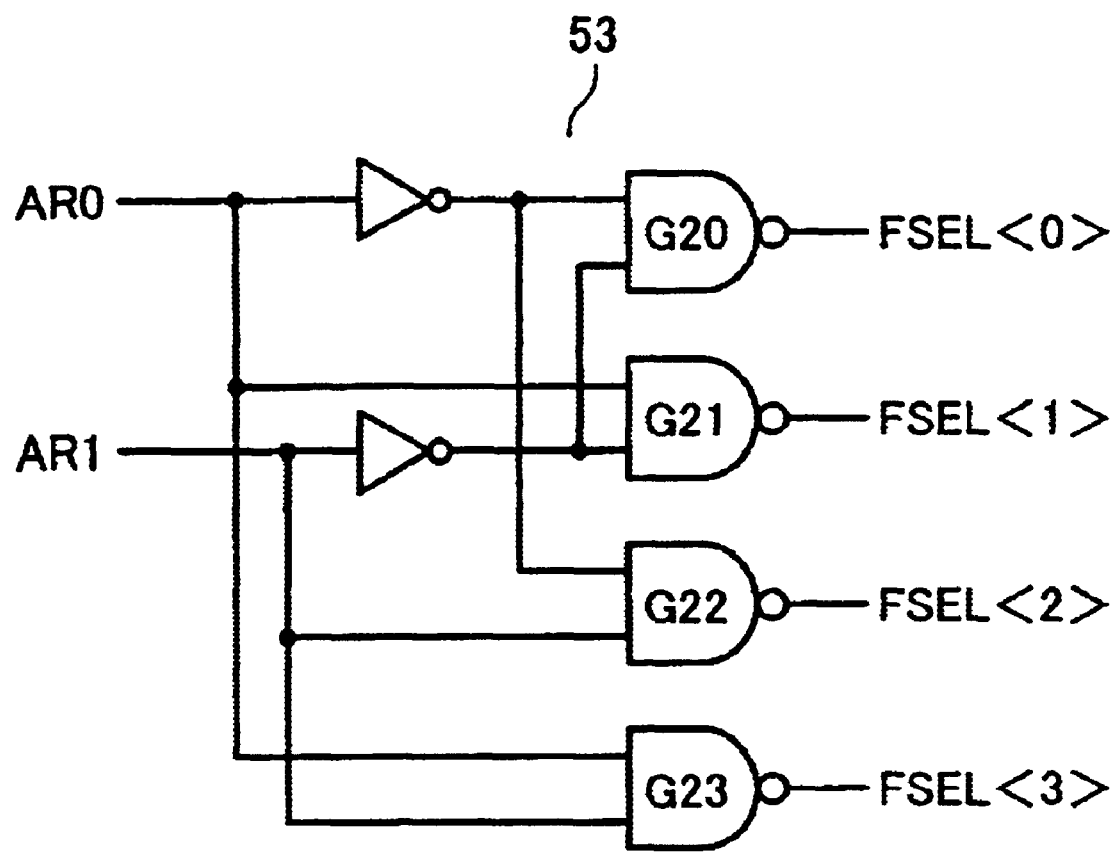
FIG. 15 is a diagram showing a configuration of a row address-responsive fuse set select signal generator circuit.

In order to substantially increase the redundant column element number through row address allocation without physically increasing spare column select lines, appropriate methods are employable, one of which is disclosed for example in U.S. Pat. No. 5,894,441. A detailed explanation will be given of an example which utilizes a single spare column select line as four substantial or "virtual" redundant column elements by 2 bits of row addresses AR0, AR1. In this case, as shown in FIG. 14, four fuse sets to be selected by row addresses AR0, AR1 are used for a single column select line. In FIG. 14, there are shown fore fuse elements FSn<0:3> each of which is provided within a different one selected by address An in the four fuse sets and data latches LATn<0:3> each storing therein fuse data of its own. These fuse data will be selected by a fuse set selector circuit 51, to which fuse set select signals FSEL<0:3> are input, and then transferred to an Ex-OR gate 52 for use as an address comparison circuit. As shown in FIG. 15 the select signals FSEL<0:3> are generated from a decode circuit 53 which decodes row addresses AR0, AR1. These select signals FSEL<0:3> are generated prior to input of a column address and then given to the fuse set selector circuit 51.

By use of such a scheme that a fuse set for a redundant column element assigned to a column repair region corresponding to an activated row element is selected by a row address to be able to output a hit signal, as shown in FIG. 14, the address comparator and the following circuits can be shared by a plurality of fuse sets.

As a result, it becomes possible to handle the part with quadrisection of a single column select line as independent redundant column elements to thereby perform column replacement control with respect to defects of column repair regions assigned thereto respectively.

With the 32-Mbit DRAM of FIG. 12, this technique is used causing the spare column select line SCSL to be divided by 3-bit input row addresses (AR<0:2>) into eight portions for use as eight redundant column elements. Accordingly, the inside of respective quadruple segments QSEG<0:7> of the normal data area and the entirety of two double segments ParityDSEG<0:1> are divided into eight column repair regions, respectively. Two regions (oblique line added portions) which are simultaneously activated within each QSEG<0:7> of FIG. 12 and within the entirety of two Parity DSEG<0:1> correspond to the same set of row addresses AR<0:2>, thus belonging to the same redundant column element's repair region, which will be called the "linked partial" repair region.

For instance, an overlap region in which the left-side memory array MA<0> which is a row repair region by the redundant row elements RELEMENTA<0:n> and a column repair region that is a ⅛ region within the entirety of two Parity DSEG<0:1> overlap each other is two oblique-line regions of Parity DSEG<0>. Redundant row elements RELEMENTA<0:n> corresponding to this overlap region intersect redundant column elements belonging to spare column select line SCSL within Parity DSEG<0> and corresponding to this overlap region, but do not cross any redundant column elements belonging to spare column select line SCSL within Parity DSEG<1> of the neighboring memory array MA<1> and corresponding to the same overlap region.

In summary, although it is possible to select cells on the redundant row elements RELEMENTA<0:n> by the spare column select line SCSL within Parity DSEG<0>, it is impossible to select cells on RELEMENT<0:n> by spare column select line SCSL within Parity DSEG<1>. Thus it can be seen that this embodiment is also one form of Embodiment 2 stated supra.

Additionally, redundant column elements corresponding to the above-noted two overlap regions and belonging to the spare column select line SCSL within Parity DSEG<1> intersect redundant row elements RELEMENTB<0:n> corresponding to a row repair region (right-side memory array MA<1>) adjacent to the row repair region (left-side memory array MA<0>) that forms such two overlap regions.

When taking a look at column redundancy, the parity data area is such that four redundant column elements are present with respect to a column repair region (512 Kbits) which is a ⅛ region of 4-Mbit part consisting of two double segments DSEG (Parity DSEG<0:1>). This is the same in column repair efficiency as the column repair region of the normal data area; thus, it would be appreciated that this is also one form of Embodiment 4.

As the parity data area is rather deficient in capacity with respect to the normal data area, it is generally difficult to equalize the repair efficiency of parity data area to that of the normal data area. However, letting parity data areas spanning or "bridging" between a plurality of (e.g. two as in this embodiment) memory arrays be a single column repair region makes it possible to uniformly equalize the repair efficiency of parity data area to that of the normal data area. This in turn makes it possible to uniformize repair efficiencies in all available repair regions on the memory chip including parity data areas at a sufficient value required; thus, it becomes possible to achieve the intended chip with minimized area and high manufacturing yields.

Incidentally, with Embodiment 6, it can be said that although a normal row element within the parity data area for selection of a cell within an overlap region of the memory array MA<0> for use as row repair region and the column repair region does not intersect any redundant column element being ⅛ part of the spare column select line SCSL within memory array MA<1> for replacing a redundant column element which is ⅛ part of the normal column select line CSL for selection of a cell within the overlap region, whereas a normal column element for cell selection within such overlap region intersects a redundant row element within another array which replaces normal row element for cell selection within the overlap region.

Note here that the language "normal row element does not intersect redundant column element" means that no cells on the redundant column element are selected upon selection of such normal row element—that is, even where such normal row element is replaced by a redundant row element, a cell corresponding to a row address of such to-be-replaced normal row element on the redundant column element will not always be replaced. The wording "not always" is used here because the above is no longer true in cases where another normal row element for selection of a cell corresponding to the row address of the normal row element to be replaced on the redundant column element is also replaced by a separate normal row element.

In addition, it can be said that the normal column element for selection of a cell within the overlap region crosses a redundant row element(s) within another array because it is possible to select a cell on the redundant row element by selection of a normal column select line CSL including a normal column element being ⅛ part of the normal column select line CSL. In case such normal column element is replaced by a redundant column element, a cell corresponding to the column address of such normal column element being replaced on the redundant row element is also replaced.

In the example of FIG. 10, the entire area with a capacity of 2C of the memory arrays MA<0> and <1> is divided by 3 into a normal data area and a parity data area. In the example of FIG. 12, the entire area is divided by 9 into a normal data area and a parity data area. These examples may be generalized as to divide the entire capacity 2C by M (M is an integer greater than or equal to 3). In this case, normal data region and a parity data region are defined as follows: A first column repair region having N (N is an integer greater than or equal to 2) redundant column elements is defined with a capacity of 2 C/M as the normal data area in such a manner that (M-1)/2 column repair regions are defined in the memory arrays MA<0> and <1>, respectively. A second column repair region having N redundant column elements is defined with a capacity of 2 C/M as the parity data area as extending over the memory arrays MA<0>, <1> in such a manner that each capacity of C/M is defined in each the memory array MA<0>, <1>.

In such a way, it is possible to uniformly equalize column repair efficiencies in all the repair regions on the chip.

Embodiment 7

FIGS. 16A and 16B show an embodiment which applies this invention to a semiconductor memory having a hierarchical word line configuration. With the hierarchical wordline scheme, as shown in FIG. 16A, a plurality of sub-word lines SWL are disposed with respect to a single main word line MWL with low electrical resistivity. The sub-word lines SWL are driven by sub-word line drivers SWLDRV which are connected at a plurality of portions of the main word line MWL. Here, a single main word line MWL may correspond to a plurality of row addresses with a plurality of sub-word line drivers SWLDRV being connected at several portions of the main word line MWL respectively (different row addresses correspond to the sub-word lines SWL being driven respectively); alternatively, one main word line MWL may correspond to a single row address with a single sub-word line driver SWLDRV being connected to main word line MWL at respective connection portions at several locations of main word line MWL.

In this way, with the hierarchical wordline scheme, a single word line (to which a single row address corresponds) is logically constituted from a plurality of fine-divided sub-word lines SWL. And as shown by dotted line in FIG. 16B, multiple sub-word lines SWL are activated simultaneously. With such an arrangement, it is possible to shorten the length of sub-word lines SWL, which in turn makes it possible to lessen word-line delays, thus enabling achievement of high speed operations. Additionally, activating only partial subword-line drivers being connected to the main word line makes it possible to limit an array region to be activated, thus obtaining advantages such as reduction in number of simultaneously operable sense amplifiers to thereby suppress electrical power consumption and suppression of internal power noises during operations of sense amps to thereby speed up the sense-amp operations.

In such hierarchical wordline scheme, in order to increase the repair efficiency of row redundancy, replacement is not performed with a single or a plurality of main word lines as a unit but performed with a single sub-word line as a unit or alternatively with multiple sub-word lines as a unit, wherein the multiple sub-word lines are arrayed in a direction perpendicular to the main wordline; still alternatively, it is considered that the sub-word lines which extend in the perpendicular direction to the main wordline are organized into groups or "bundles" aligned in a wordline elongate direction, each of which bundles consists of one or several sub-word lines for use as a unit of replacement. In a way corresponding thereto, the redundant row element is formed of one or a plurality of spare word lines as disposed in a direction perpendicular to wordline; alternatively, some of them may be combined together in the wordline elongate direction to thereby make up the redundant row element. Note here that the plurality of spare wordlines as disposed in the wordline perpendicular direction for constitution of the redundant row element should not exclusively be laid out continuously. Also note that in case one or a plurality of spare wordlines are bundled together in the wordline elongate direction to form the redundant row element also, continuing ones should not always be combined together.

In the row redundancy system thus arranged in this way, it is considered that shortening the length of sub-word lines results in a likewise decrease in relative ratio of the width of a row repair region in a word-line direction to the width of a column repair region in the wordline direction. Simultaneously, it is considered that the number of redundant column elements which cross redundant row elements decreases if the number of such redundant column element is kept constant. Further, if the sub-wordline length is made shorter, then more than one redundant row element which crosses no redundant column elements can take place in some cases.

FIG. 16B shows a redundancy system along with a memory array layout when looking at a layer of sub-word lines SWL. Here, a row repair region to be relieved by a given redundant row element RELEMENT is configured from a plurality of sub-word lines SWL which are driven by multiple sub-word line drivers SWLDRV aligned into a single array in the direction at right angles to word lines. This row repair region and its neighboring row repair region in a wordline direction are arranged so that sub-word lines SWL physically (spatially) thereof have a cylinder bush or "nesting" structure. The redundant row element RELEMENT is formed of a single spare sub-word line SSWL or a plurality of spare sub-word lines SSWL as disposed in the perpendicular direction to wordlines or, alternatively, is arranged in a form which organizes them into groups in the wordline direction, each group consisting of one or several spare sub-word lines SSWL. At this time, in case the redundant row element is made up of a plurality of spare sub-word lines SSWL, multiple ones of them may be disposed continuously or alternatively may not always be continuously extended.

Although FIG. 16B shows a single redundant column element CELEMENT consisting of one or a plurality of spare column select lines and a single column repair region CRA to be relieved thereby, three row repair regions RRA<a>, <b>, <c> are involved in this column repair region CRA with two row repair regions RRA<d>, <e> crossing each other.

While RELEMENT<A> of the redundant row elements, which corresponds to an overlap region of the row repair region RRA<a> and the column repair region CRA, intersects redundant column element CELEMENT corresponding to the overlap region, RELEMENT<B> corresponding to another overlap region of the row repair region RRA<c> and the column repair region CRA does not cross any redundant column element CELEMENT corresponding to the another overlap region.

Figure 17:
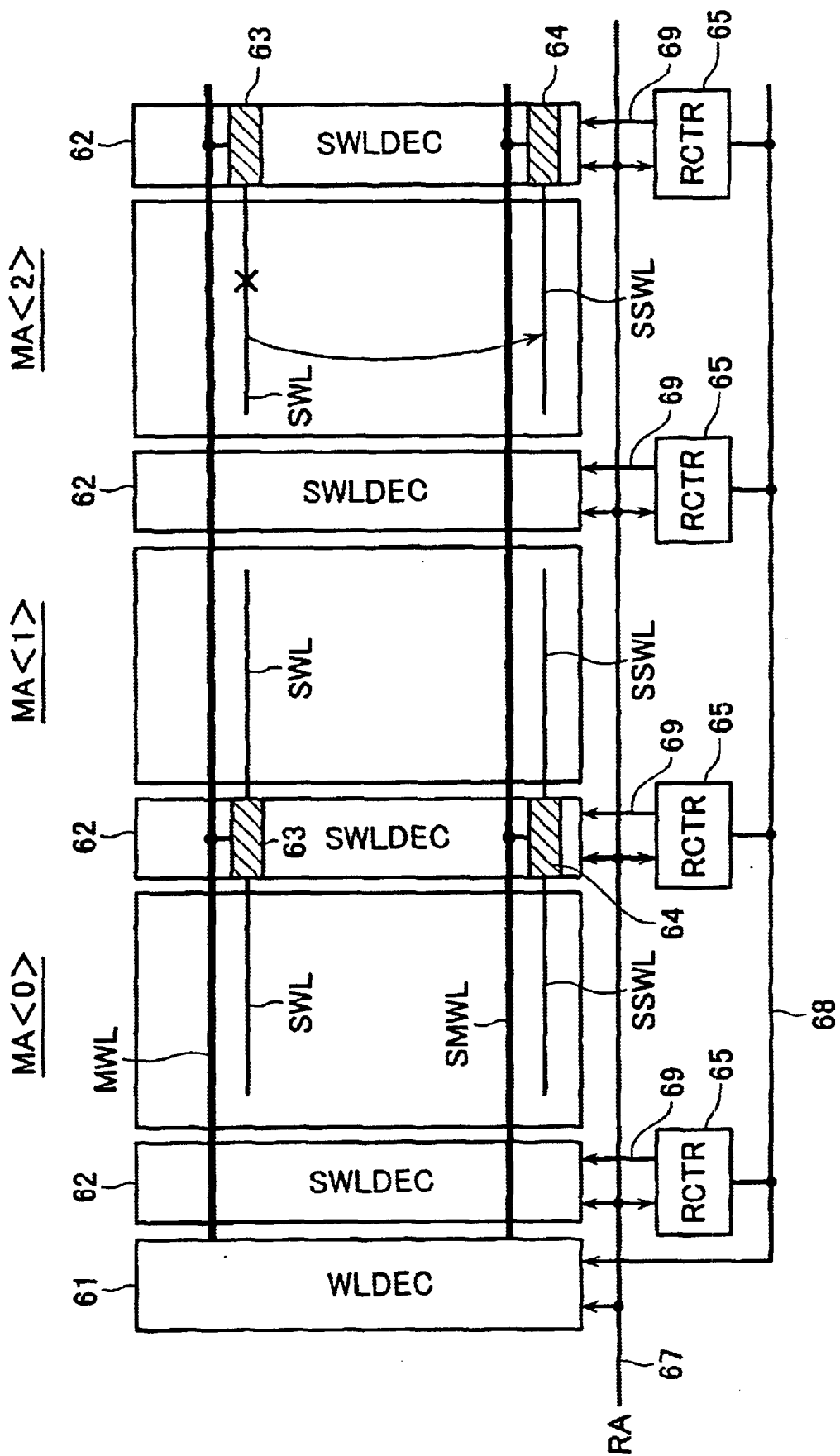
FIG. 17 is a diagram showing an exemplary configuration of a row replacement control circuit unit in the seventh embodiment.
Figure 18:
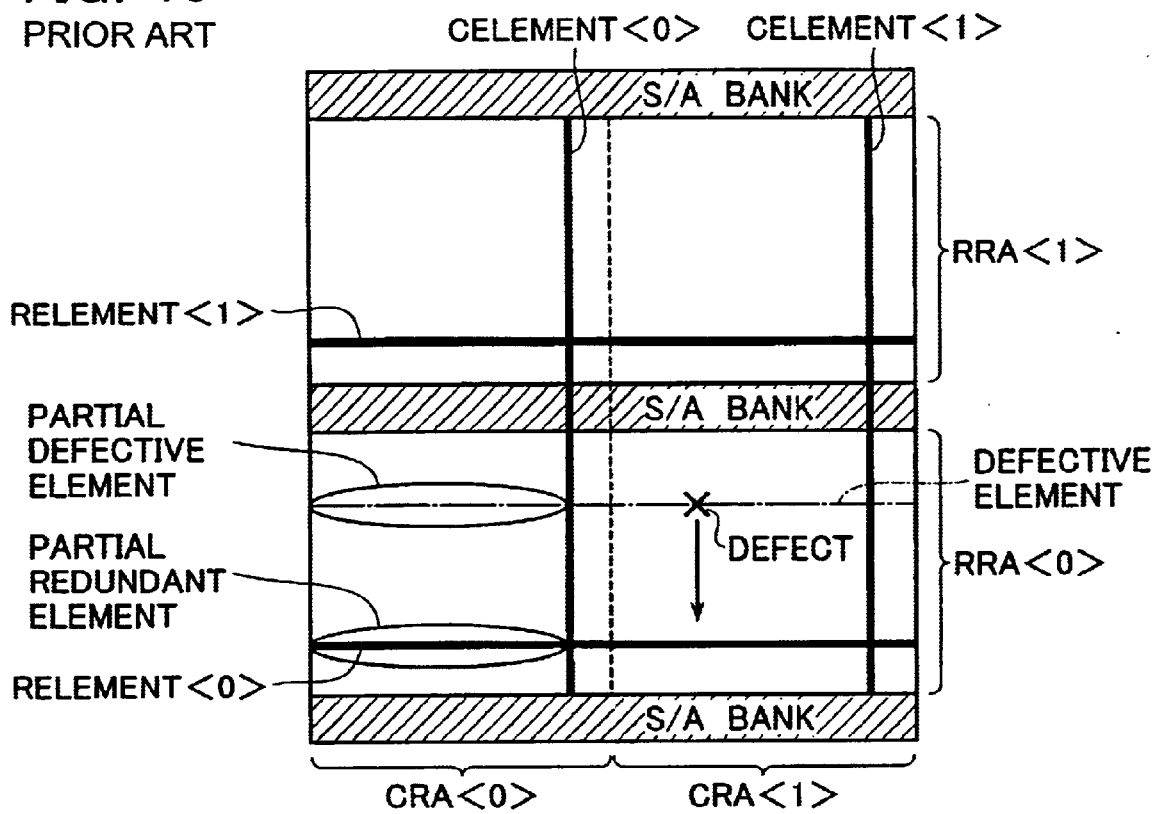
FIG. 18 is a diagram showing one prior known semiconductor memory redundancy system.
Figure 19:
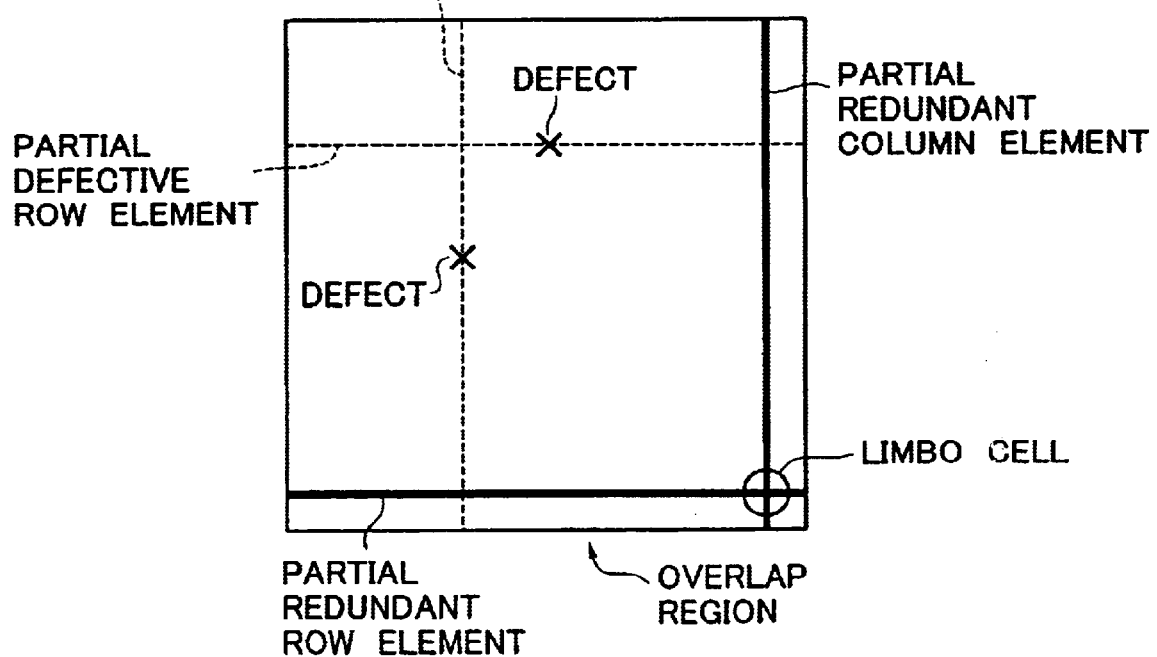
FIG. 19 is a diagram showing a defect replacement manner in an overlap region of a row repair region and a column repair region of the prior art system.
Figure 20:
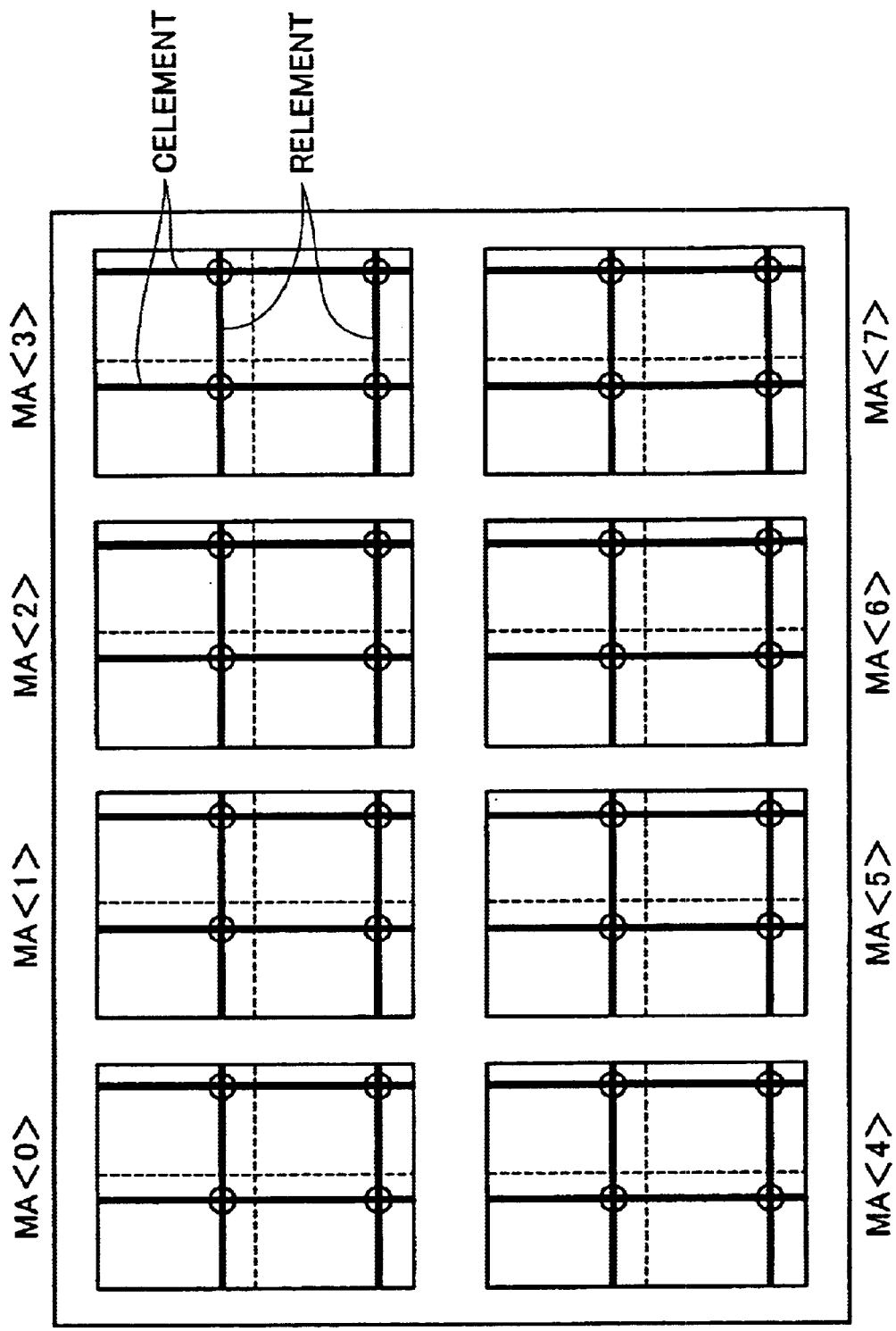
FIG. 20 is a diagram showing a memory chip configuration for explanation of problems faced with the prior art.

A detailed explanation will next be given of a redundancy scheme employable in the wordline hierarchy scheme of this embodiment with reference to FIG. 17. Although the column redundancy per se is not explained here, any one of the schemes as have been explained in the embodiments stated previously is applicable. As shown in FIG. 17, a cell array has a plurality of memory arrays MA<0>, <1>, <2>, . . . Main word lines MWL (only one of them is depicted) are disposed to span these memory arrays. Sub-ward lines SWL as simultaneously selected by main wordline MWL are disposed in units of respective memory arrays. These sub-word lines SWL are used to select memory cells arranged in the wordline direction, which cells are within the memory arrays respectively. Each subwordline SWL becomes a normal row element for use as a unit of defective row replacement.

A row decoder has a main word-line decoder 61 for selection of main word line MWL and subword-line decoders 62 for driving subword lines SWL as provided in units of memory arrays. Each subwordline decoder 62 contains therein a subwordline driver 63 for driving a subwordline SWL corresponding to a presently selected main wordline MWL.

In a way corresponding to the main wordline MWL, at least one spare main wordline SMWL is disposed to span the memory arrays. Spare subword lines SSWL that are simultaneously selected by this spare main wordline SMWL are disposed as redundant row elements within each memory array. These spare subwordlines SSWL are selected by spare main wordline SMWL and then driven by a spare subwordline driver 64 within the spare wordline decoder 62 to thereby perform spare cell selection.

A row replacement control circuit 65 is provided in each spare wordline decoder 62. This row replacement control circuit 65 has a defect address storage circuit and an address comparator circuit in a similar way to that of the row replacement control circuits 31a, 31b as previously explained in FIG. 6. Row address data RA to be transferred over a row address signal bus 67 is supplied to the main wordline decoder 61 and each subwordline decoder 62 and simultaneously supplied to each row replacement control circuit 65 also. Upon input of a defect address, the row replacement control circuit 65 outputs a first activation signal 68 used to activate spare main wordline SMWL and a second activation signal 69 for spare subwordline SSWL activation. The first activation signal 68 is sent to main wordline decoder 61 to thereby make the spare main wordline SMWL active. Note however that at this time, a presently selected normal main wordline MWL is hardly made inactive and retains its active state. This is the condition required for replacement of only part of the plurality of subword lines SWL as simultaneously selected by main wordline MWL. The second activation signal 69 being output from a row replacement control circuit 65 is used to inactivate a defective subword line SWL of the plurality of subwordlines SWL being simultaneously selected by main wordline MWL while activating its corresponding spare subwordline SSWL selected by the spare main wordline SMWL. With such control, in the example shown in FIG. 17, a defective subword line SWL within the memory array MA<2> is replaced with a spare subwordline SSWL within the same memory array MA<2>.

It must be noted in FIG. 17 that the main wordline MWL and/or spare main wordline SMWL may be formed of a single signal line or a bundle of multiple signal lines in some cases. Alternatively the subword line SWL as selected by a single main wordline MWL within each memory array is configurable by a plurality of ones which are disposed in a perpendicular direction to main wordline. In this case, the spare wordlines SSWL are similarly arranged so that a plurality of ones are disposed relative to a single spare main wordline SMWL within each memory array. And in this case, replacement is also executable with a bundle of multiple subword lines SWL as disposed in the main wordline perpendicular direction being as a single row element and with a bundle of several spare subwordlines SSWL as a single redundant row element. In this case, such a state with row elements being simultaneously activated means that any one of the subword lines in each row element is activated. Optionally, replacement is also done with a respective one of the multiple subword lines SWL as disposed in the main wordline perpendicular direction being as a single row element and with each of several spare subwordlines SSWL as a single redundant row element. To perform control for the latter replacement, different row addresses or redundancy use row addresses are may be assigned to the respective subwordlines and spare subwordlines. Thus, in the row replacement control circuit 65 also, its address storage circuit is to be programmed in such a way as to generate an activation signal 69 which reflects row address information thereof. The output activation signal 69 has such the redundancy use row address. When a plurality of spare main wordlines are disposed, the activation signal 68 may be generated to have such the redundancy use row address for selecting one of the spare main wordlines.

Although the case of hierarchical wordline schemes was explained above, a similar redundancy system is configurable in the case of hierarchical column select line schemes. In this case, multiple sub-column select lines are disposed with respect to a single main column select line, wherein the subcolumn select lines are driven by subcolumn select line drivers as connected to a plurality of portions of a main column select line. A redundant column element is formed of a single spare subcolumn select line as disposed in parallel to column select lines or alternatively is designed in the form which organizes them into groups in a column select line direction. Note here that in case the redundant column element is made up of a plurality of spare subcolumn select lines, some of them may be disposed continuously or alternatively may not always be continuously extended.

Also note that the redundant column element may optionally be arranged to employ one or a plurality of pairs of spare bit lines (or part thereof) other than the case where it is formed of a single spare column select line or part with this being divided by a row address(es).

It has been stated that in accordance with this invention, a redundancy system with enhanced relief efficiency is obtained by specifically selecting certain ones which do not intersect each other as a redundant column element and a redundant row element corresponding to an overlap region of a column relief region and a row relief region within a certain memory array.

While the present invention has been particularly shown and described with reference to the embodiments, it will be understood by those skilled in the art that various changes in form and detail may be made without departing from the spirit, scope, and teachings of the invention.

What is claimed is:

1. A semiconductor memory device comprising:
   a cell array having a plurality of memory cells;
   a plurality of first normal elements each defined within said cell array as a group of memory cells arranged in a first direction with a first select line for memory cell selection;
   a plurality of second normal elements each defined within said cell array as a group of memory cells arranged in a second direction with a second select line for memory cell selection, each said second normal element selecting one or more memory cells in operative association with a corresponding one of said first normal elements;
   a plurality of first redundant elements disposed for replacement of a defective first normal element within said cell array;
   a plurality of second redundant elements disposed for replacement of a defective second normal element within said cell array;
   first repair regions each defined within said cell array as a group of first normal elements with permission of replacement by each said first redundant element; and
   second repair regions each defined within said cell array as a group of second normal elements with permission of replacement by each said second redundant element, wherein
      at least two of said plurality of first normal elements are activated simultaneously,
      whether each of such simultaneously activated at least two first normal elements is replaced by said first redundant element is controlled independently of each other, and
      at least one of said second redundant elements, which repairs a second normal element having a defect that locates in one of said first repair regions including one of said simultaneously activated at least two first normal elements, does not intersect said one of said simultaneously activated at least two first normal elements.

2. The semiconductor memory device according to claim 1, wherein said second normal element having a defect that locates in one of said first repair regions including one of said simultaneously activated at least two first normal elements is also replaceable by one of said plurality of second redundant elements which intersect said one of said simultaneously activated at least two first normal elements.

3. The semiconductor memory device according to claim 1, wherein one of said first repair regions including one of said simultaneously activated at least two first normal elements and another one of said first repair regions including another one of said simultaneously activated at least two first normal elements are disposed adjacent to each other, one of said second redundant elements intersecting said another one of said simultaneously activated at least two first normal elements and repairing a second normal element having a defect that locates in said first repair region including said one of said simultaneously activated at least two first normal elements.

4. The semiconductor memory device according to claim 3, wherein a select circuit is disposed between said first repair regions disposed adjacent to each other for selecting a first normal element.

5. The semiconductor memory device according to claim 1, wherein at least three first repair regions, each of which includes one of at least three simultaneously activated first normal elements, are serially disposed, and wherein
   at least two said second redundant elements, which are able to repair a second normal element having a defect that locates in one of said first repair regions including one of said simultaneously activated at least three first normal elements, intersect the remaining any one of said simultaneously activated at least three first normal elements.

6. The semiconductor memory device according to claim 5, wherein select circuits are disposed between said first repair regions disposed serially for selecting a first normal element.

7. The semiconductor memory device according to claim 5, wherein
   said cell array comprises three or more memory arrays serially disposed with row decoders interposed between adjacent ones thereof for simultaneous selection of first normal elements in a row address responsive manner in a way such that at least one is selected from each memory array,
   said plurality of first redundant elements are disposed in correspondence to the respective memory arrays in such a manner as to belong thereto on at least one-by-one basis to replace a defective first normal element therein independently of each other, and
   said plurality of second redundant elements are disposed within the respective memory arrays in such a manner as to belong thereto on at least one-by-one basis while crossing said first redundant element within a corresponding memory array, and are used independently of each other for defective second normal element replacement within at least one presently selected memory array.

8. The semiconductor memory device according to claim 1, wherein
   said cell array comprises first and second memory arrays neighboring each other with a row decoder interposed therebetween;
   said first normal elements in said first and second memory arrays are simultaneously activated by said row decoder in a row address responsive manner in such a way that at least one is selected from each of said first and second memory array;
   said plurality of first redundant elements are disposed in correspondence with said first and second memory arrays in such a manner as to belong thereto on at least one-by-one basis, and used independently of each other for defective first normal element replacement within said first and second memory arrays, respectively; and
   said plurality of second redundant elements are disposed in correspondence with said first and second memory arrays in such a manner as to belong thereto on at least one-by-one basis while intersecting said first redundant elements in correspondence with each of said first and second memory array, and used independently of each other for defective second normal element replacement within both of said first and second memory arrays.

9. The semiconductor memory device according to claim 8, further comprising:

column decoders for selecting second normal elements of said first and second memory arrays, respectively;

redundant row decoders activated by row replacement control signals as generated in response to defective row addresses for activating said first redundant elements, respectively;

redundant column decoders activated by column replacement control signals as generated in response to defective column addresses for selecting said second redundant elements, respectively; and a replacement control circuit configured to output said row replacement control signals and column replacement control signals in accordance with defect addresses, and to have such an overlap region that one of said first repair regions defined within one of said first and second memory arrays and one of said second repair regions are at least partially overlapped, said one of said first repair regions being defined as that said first normal elements therein are replaceable by said first redundant element disposed in correspondence with said one of said first and second memory arrays, said one of said second repair regions being defined as that said second normal elements therein are replaceable by said second redundant element disposed in the remaining one of said first and second memory arrays.

10. The semiconductor memory device according to claim 8, wherein each of said first repair regions to which said first redundant elements are assigned is defined in either of said first and second memory arrays, respectively, and wherein at least one of said second repair regions to which said second redundant elements are assigned is defined as extending over said first and second memory arrays.

11. The semiconductor memory device according to claim 8, wherein said first repair regions are row repair regions as defined by said row redundant elements, each row repair region covering an entirety of each said memory array, and wherein when letting an all-cell capacity of each memory array be represented by C [bits], said second repair region comprises a first column repair region with a capacity of 2 C/M (M is an integer greater than or equal to 3) as set including N (N is an integer greater than or equal to 2) redundant column elements in each memory array, (M-1)/2 first column repair regions being defined in each said memory array, and a second column repair region with a capacity of 2 C/M as set including N redundant column elements while combining together two remaining capacity C/M regions of respective ones of said memory arrays.

12. The semiconductor memory device according to claim 11, wherein said first column repair region is a normal data area, whereas said second column repair region is a parity data area for storing therein check-use data for error checking/correcting data of said normal data area.

13. The semiconductor memory device according to claim 8, wherein each said memory array is subdivided into a plurality of sub-arrays with the same row address allocated thereto for simultaneously activating a specified number of ones at a time, and a single spare column select line as continuously formed to span said plurality of sub-arrays is allocated to different row addresses to be used as said plurality of redundant column elements.

14. The semiconductor memory device according to claim 1, wherein each of said first normal element comprises one or a plurality of word lines as said first select line, each of said first redundant element comprises one or a plurality of spare word lines, each of said second normal element comprises one or a plurality of bit lines selected by a single column address, and each of said second redundant element is one or a plurality of spare bit lines selected by a single defective column address.

15. The semiconductor memory device according to claim 1, wherein said cell array has a plurality of memory arrays, a plurality of main word lines provided to span these memory arrays, a plurality of sub-word lines disposed within each said memory array at least one of which is selected by the corresponding main word line in each said memory array, at least one spare main word line provided to span said plurality of memory arrays, and at least one spare sub-word line disposed in each said memory array at least one of which is selected by the corresponding spare main word line in each said memory array, and said sub-word lines are for use as said first normal elements, whereas said spare sub-word line in each said memory array is used as said first redundant element.

16. A semiconductor memory device comprising:

simultaneously activated first and second memory arrays each having a plurality of memory cells, a plurality of normal row elements each defined in said memory arrays as a group of memory cells arranged in a row direction, and a plurality of normal column elements each defined in said memory arrays as a group of memory cells arranged in a column direction;

redundant row elements disposed in correspondence to said first and second memory arrays to be used for defective normal row element replacement in the respective memory arrays independently of each other; and redundant column elements disposed in correspondence to said first and second memory arrays in such a manner that at least one of them corresponds to each said memory array while intersecting said redundant row element within a corresponding memory array and used for defective normal column element replacement independently of each other, wherein a row repair region defined as a group of normal row elements with permission for replacement by each said redundant row element disposed in one of said first and second memory arrays and a column repair region defined as a group of normal column elements with permission of replacement by use of each said redundant column element disposed in the remaining one of said memory arrays are set to have an overlap region in which said row and column repair regions are at least partially overlapped each other.

17. The semiconductor memory device according to claim 16, wherein said redundant column element within a memory array to which said overlap region belongs is also used for replacement of a defective normal column element in such overlap region.

18. The semiconductor memory device according to claim 16, wherein said first and second memory arrays are disposed adjacent to each other with a row decoder commonly shared thereby interposed therebetween, and wherein said row decoder is arranged for simultaneously selecting two normal row elements each belonging to said first and second memory arrays.

19. The semiconductor memory device according to claim 16, wherein said normal row element comprises one or a plurality of word lines, said redundant row element comprises one or a plurality of spare word lines, said normal column element comprises one or a plurality of bit lines selected by a single column address, and said redundant column element comprises one or a plurality of spare bit lines selected by a single defective column address.

20. The semiconductor memory device according to claim 16, wherein said first repair regions are row repair regions each covering an entirety of each said memory array as defined by row redundant elements disposed in correspondence with said memory arrays respectively on at least one-by-one basis, and wherein when letting an all-cell capacity of each memory array be represented by C [bits], said second repair region comprises a first column repair region with a capacity of 2 C/M (M is an integer greater than or equal to 3) as set including N (N is an integer greater than or equal to 2) redundant column elements in each memory array, (M-1)/2 first column repair regions being defined in each said memory array, and a second column repair region with a capacity of 2 C/M as set including N redundant column elements while combining together two remaining capacity C/M regions of respective ones of said memory arrays.

21. The semiconductor memory device according to claim 16, wherein said first column repair region is a normal data area, whereas said second column repair region is a parity data area for storing therein check data for error checking/correcting data of said normal data area.

22. The semiconductor memory device according to claim 16, wherein each said memory array is divided into a plurality of sub-arrays with the same row address being allocated thereto for simultaneously activating a specified number of sub-arrays at a time, and a single spare column select line as continuously formed to span said plurality of sub-arrays is allocated to different row addresses to be used as said plurality of redundant column elements.

23. A semiconductor memory device comprising:

a cell array having a plurality of memory cells;

a plurality of main word lines disposed in said cell array;

a plurality of sub-word lines simultaneously selectable upon activation of each said main word line, each said sub-word line being for selecting more than one memory cell disposed within a specified range in a row direction;

a plurality of column select lines for execution of memory cell selection in association with each of said sub-word line;

at least one spare main word line disposed for repairing a defective cell; and a plurality of spare sub-word lines simultaneously selected by said spare main word lines, each of said spare sub-word line being for performing spare cell selection within a specified range in the row direction, wherein when any one of said plurality of sub-word lines selected by a certain main word line is found defective, the defective sub-word line is made inactive while letting a presently selected main word line stay active, whereas said spare main word line is activated, thereby permitting activation of one of a plurality of spare sub-word lines, as selected by this spare main word line, which is used for replacement of the defective sub-word line.

24. The semiconductor memory device according to claim 23, further comprising more than one spare column select line for repairing said column select lines, wherein a defective column select line for performing memory cell selection in association with a certain sub-word line is replaced by the spare column select line for spare cell selection in association with another sub-word line to be activated simultaneously along with the sub-word line.

25. The semiconductor memory device according to claim 24, further comprising another spare column select line for replacement of said column select line, wherein a defective column select line for performing memory cell selection in association with a certain sub-word line is also replaced by said another spare column select line for spare cell selection in association with the sub-word line.

26. A semiconductor memory device comprising:

a cell array having a plurality of memory cells, a plurality of normal row elements each defined in said cell array as a group of memory cells arranged in a row direction, and a plurality of normal column elements each defined in said cell array as a group of memory cells arranged in a column direction;

a plurality of redundant row elements disposed for repairing more than one defective normal row element of said cell array; and a plurality of redundant column elements disposed for repairing more than one defective normal column element of said cell array, wherein at least two first and second row repair regions, each of which is defined as a group of normal row elements with permission of replacement by each said redundant row element, are set to have different cell capacities with each other, and repair efficiency in each column repair region defined as a group of normal column elements with permission of replacement by each of said plurality of redundant column elements is set to become equal to one another within said cell array.

* * * * *